(12) United States Patent
Sun et al.

(10) Patent No.: US 8,785,328 B2
(45) Date of Patent: Jul. 22, 2014

(54) MASK PATTERN FOR HOLE PATTERNING AND METHOD FOR FABRICATING SEMICONDUCTOR DEVICE USING THE SAME

(75) Inventors: Jun-Hyeub Sun, Gyeonggi-do (KR); Sung-Kwon Lee, Gyeonggi-do (KR); Sang-Oh Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 11 days.

(21) Appl. No.: 13/607,898

(22) Filed: Sep. 10, 2012

(65) Prior Publication Data

US 2013/0337652 A1    Dec. 19, 2013

(30) Foreign Application Priority Data

Jun. 15, 2012    (KR) .......................... 10-2012-0064472

(51) Int. Cl.
    *H01L 21/311*    (2006.01)
(52) U.S. Cl.
    USPC ........................................................ 438/703
(58) Field of Classification Search
    None
    See application file for complete search history.

(56) References Cited

U.S. PATENT DOCUMENTS

2010/0221670 A1    9/2010    Maekawa
2010/0243161 A1    9/2010    Tran

FOREIGN PATENT DOCUMENTS

| KR | 1020080026832 | 3/2008 |
|----|---------------|--------|
| KR | 100819673     | 4/2008 |
| KR | 100825801     | 4/2008 |
| KR | 1020090055819 | 6/2009 |
| KR | 1020090070472 | 7/2009 |
| KR | 1020100109159 | 10/2010 |
| KR | 1020100134418 | 12/2010 |

*Primary Examiner* — Scott B Geyer
(74) *Attorney, Agent, or Firm* — IP & T Group LLP

(57) ABSTRACT

A method for fabricating a semiconductor device includes forming an etching target layer over a substrate including a first region and a second region; forming a hard mask layer over the etching target layer; forming a first etch mask over the hard mask layer, wherein the first etch mask includes a plurality of line patterns and a sacrificial spacer layer formed over the line patterns; forming a second etch mask over the first etch mask, wherein the second etch mask includes a mesh type pattern and a blocking pattern covering the second region; removing the sacrificial spacer layer; forming hard mask layer patterns having a plurality of holes by etching the hard mask layer using the second etch mask and the first etch mask; and forming a plurality of hole patterns in the first region by etching the etching target layer using the hard mask layer patterns.

19 Claims, 36 Drawing Sheets

MASK PATTERN FOR HOLE PATTERNING AND METHOD FOR FABRICATING SEMICONDUCTOR DEVICE USING THE SAME

CROSS-REFERENCE TO RELATED APPLICATIONS

The present application claims priority of Korean Patent Application No. 10-2012-0064472, filed on Jun. 15, 2012, which is incorporated herein by reference in its entirety.

BACKGROUND

1. Field

Exemplary embodiments of the present invention relate to a method for fabricating a semiconductor device, and more particularly, to a mask pattern for hole patterning and a method for fabricating a semiconductor device using the same.

2. Description of the Related Art

In a DRAM fabrication process, since a hole patterning process using parameters of 30 nm or below is below the resolution of a scanner, holes may be defined by performing a spacer patterning technology (SPT) process twice in directions crossing each other, respectively. The hole patterning process may include a process for defining contact holes or holes to form storage nodes. The hole patterning process is performed into a cell matrix region.

A spacer patterning process may be a positive SPT (PSPT) process or a negative SPT (NSPT) process. The positive SPT (PSPT) process is a process in which spacer patterns are used as an etch mask. The negative SPT (NSPT) process is a process in which an etch mask substance is filled between spacer patterns, the spacer patterns are removed and the etch mask substance is used as an etch mask.

For hole patterning, the positive SPT (PSPT) process may be performed twice or the negative SPT (NSPT) process may be performed twice.

In the case of performing the positive SPT (PSPT) process twice, since a peripheral region is entirely open, a periphery-close mask (PCM), which covers the peripheral region, may be used. However, because an overlay (O/L) margin may not be sufficient, poor patterning may occur in an edge region of a cell matrix region. Conversely, in the case of performing the negative SPT (NSPT) process twice, although a PCM is not necessary, patterning is difficult because the structure of an etch mask formed in the peripheral region is complicated.

Since the positive SPT (PSPT) process has a structure in which the peripheral region is entirely open, etching of the peripheral region may be prevented by adopting the PCM. However, holes may be defined partially or defined in an undesired manner since an overlay between the PCM and the cell matrix region may not be sufficient. Here, even when holes are defined, poorly shaped holes may be formed. These holes are likely not to be open in a subsequent process or result in poor patterns.

SUMMARY

Embodiments of the present invention are directed to a mask pattern which can prevent poor patterning of a cell matrix edge region without adopting a mask (PCM) covering a peripheral region, and a method for fabricating a semiconductor device using the same.

In accordance with an embodiment of the present invention, a method for fabricating a semiconductor device may include: forming an etching target layer over a substrate including a first region and a second region; forming a hard mask layer over the etching target layer; forming a first etch mask over the hard mask layer, wherein the first etch mask includes a plurality of line patterns and a sacrificial spacer layer formed over the line patterns; forming a second etch mask over the first etch mask, wherein the second etch mask includes a mesh type pattern and a blocking pattern covering the second region; removing the sacrificial spacer layer; forming hard mask layer patterns having a plurality of holes by etching the hard mask layer using the second etch mask and the first etch mask; and forming a plurality of hole patterns in the first region by etching the etching target layer using the hard mask layer patterns as an etch mask.

In accordance with another embodiment of the present invention, a method for fabricating a semiconductor device may include: forming an etching target layer over a substrate including a first region and a second region; forming a hard mask layer over the etching target layer; forming a first etch mask including a plurality of first line patterns alternately disposed with a plurality of second line patterns over the hard mask layer; forming a second etch mask over the first etch mask, wherein the second etch mask includes a plurality of third line patterns extending in a direction crossing with the first and second line patterns and a blocking pattern covering the second region; forming hard mask layer patterns having a plurality of holes by etching the hard mask layer using the second etch mask and the first etch mask; and forming a plurality of hole patterns in the first region by etching the etching target layer using the hard mask layer patterns as an etch mask.

In accordance with yet another embodiment of the present invention, a mask pattern suitable for patterning holes in a cell matrix region may include: a plurality of upper level line patterns extending in a direction crossing with the lower level line patterns, wherein the plurality of upper level line patterns are located at a vertically higher level than the plurality of lower level line patterns; and a blocking pattern covering an edge region of the cell matrix region.

DETAILED DESCRIPTION

Figure 1A:
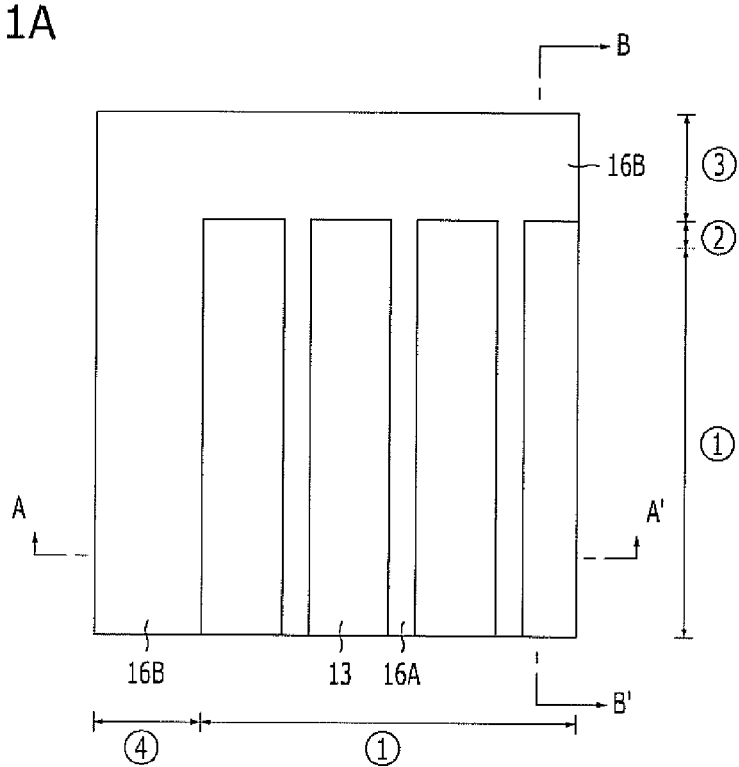
FIGS. 1A to 1K are plan views showing a method for fabricating a semiconductor device in accordance with a first embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

In embodiments of the present invention, both a negative spacer pattern technology (NSPT) process and a positive SPT (PSPT) process are performed so that a layout is changed to prevent poor patterning of holes in a cell matrix region while not using a periphery-close mask (PCM), which covers a peripheral region.

FIGS. 1A to 1K are plan views showing a method for fabricating a semiconductor device in accordance with a first embodiment of the present invention. FIGS. 2A to 2K are cross-sectional views taken along the lines A-A' of FIGS. 1A to 1K, respectively. FIGS. 3A to 3K are cross-sectional views taken along the lines B-B' of FIGS. 1A to 1K, respectively.

Figure 2A:
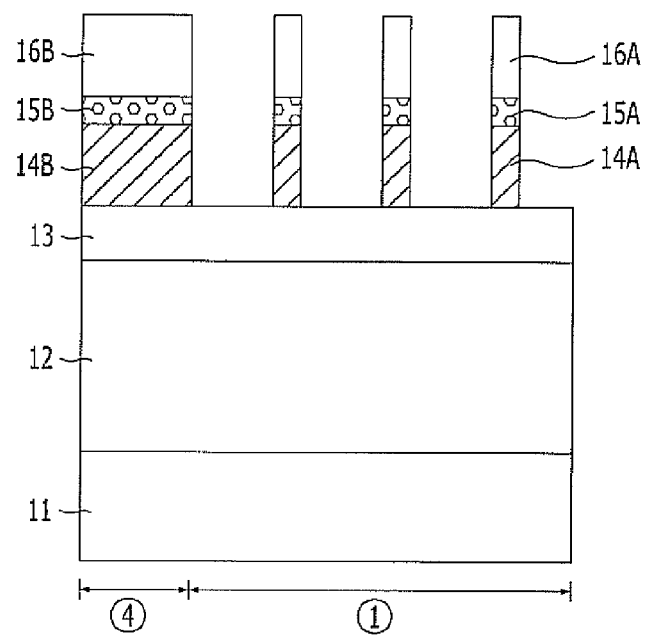
FIGS. 2A to 2K are cross-sectional views taken along the lines A-A' of FIGS. 1A to 1K, respectively.
Figure 3A:
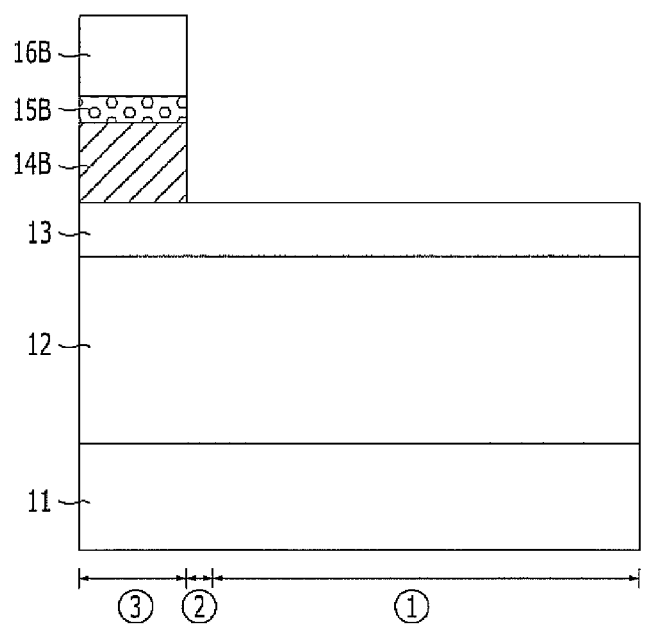
FIGS. 3A to 3K are cross-sectional views taken along the lines B-B' of FIGS. 1A to 1K, respectively.

Referring to FIGS. 1A, 2A and 3A, an etching target layer 12 (FIG. 2A) is formed on a substrate 11. The substrate 11 may include a first region $\hat{1}$, a second region $\hat{2}$, a third region $\hat{3}$ and a fourth region $\hat{4}$. The first region $\hat{1}$ is a region where a plurality of holes are to be subsequently defined. The third region $\hat{3}$ and the fourth region $\hat{4}$ are regions where holes are not defined. The second region $\hat{2}$ is a boundary region between the first region $\hat{1}$ and the third region $\hat{3}$ and is an edge region of the first region $\hat{1}$. The first region $\hat{1}$ may include a cell matrix region, and the third region $\hat{3}$ and the fourth region $\hat{4}$ may include peripheral regions. The second region $\hat{2}$ may include a cell matrix edge region. Hereinbelow, in the first embodiment, the first region $\hat{1}$ will be referred to as a 'cell matrix region', the third region $\hat{3}$ will be referred to as a 'first peripheral region', the second region $\hat{2}$ will be referred to as a 'cell matrix edge region', and the fourth region $\hat{4}$ will be referred to as a 'second peripheral region'.

The etching target layer 12 may include various substances. For example, the etching target layer 12 may include an oxide layer, a nitride layer, a silicon layer or a metal layer. Hereinbelow, in the first embodiment, the etching target layer 12 may include an oxide layer. The etching target layer 12 may include a substance for defining therein contact holes or holes to form storage nodes. A hard mask layer 13 is formed on the etching target layer 12. The hard mask layer 13 serves as an etch mask in etching the etching target layer 12. Accordingly, the hard mask layer 13 and the etching target layer 12 may be respectively formed of substances with different etching selectivities, respectively. The hard mask layer 13 may include a single-layered structure or a multi-layered structure of at least two layers. For example, the hard mask layer 13 may be formed as a single layer selected from a polysilicon layer, an oxide layer and a nitride layer or as a multi-layer by stacking these layers. In the first embodiment, when the etching target layer 12 includes an oxide layer, the hard mask layer 13 may be formed by stacking a polysilicon layer, an oxide layer and a nitride layer. In this way, as the hard mask layer 13 having the multi-layered structure is formed by stacking substances with different etching selectivities, respectively, these layers may be prevented from being simultaneously etched. Furthermore, by using the hard mask layer 13 with the multi-layered structure, etching with a high aspect ratio is obtained when patterning the etching target layer 12.

A plurality of first line patterns 14A are formed on the hard mask layer 13. The first line patterns 14A may extend in a first direction. The first line patterns 14A may be formed in the cell matrix region $\hat{1}$. In addition to the first line patterns 14A, a peripheral region blocking pattern 14B may be formed in the first and second peripheral regions $\hat{3}$ and $\hat{4}$ The first line patterns 14A may be coupled with the peripheral region blocking pattern 14B. That is to say, the first line patterns 14A and the peripheral region blocking pattern 14B may be simultaneously formed. The plurality of first line patterns 14A may be formed with a constant spacing. The first line patterns 14A and the peripheral region blocking pattern 14B may include a carbon-containing layer. According to an example, the carbon-containing layer may include a carbon layer, which may be formed through spin-on coating. The carbon layer formed through spin-on coating in this way is referred to as 'spin-on carbon (SOC)'.

The first line patterns 14A and the peripheral region blocking pattern 14B may be used as a mask for etching the hard mask layer 13. The first line patterns 14A and the peripheral region blocking pattern 14B may be formed using a substance other than the carbon-containing layer, where the substance has an etching selectivity with respect to the hard mask layer 13.

In order to form the first line patterns 14A and the peripheral region blocking pattern 14B, first silicon oxynitride layer patterns 15A and 15B may be used as an etch mask. Alternate to the first silicon oxynitride layer patterns 15A and 15B, a substance with an etching selectivity with respect to the carbon-containing layer may be used.

The first silicon oxynitride layer patterns 15A and 15B may be patterned using first photoresist patterns 16A and 16B. While not shown, an anti-reflective layer may be additionally formed on the first silicon oxynitride layer patterns 15A and 15B. The anti-reflective layer serves to prevent exposure characteristics from deteriorating due to scattered reflection while forming the first photoresist patterns 16A and 16B. The anti-reflective layer may include a BARC (bottom anti-reflective coating). In the case where the first silicon oxynitride layer patterns 15A and 15B can perform a function of preventing scattered reflection, the anti-reflective layer may be omitted.

A plurality of first photoresist patterns 16A, which are formed in the cell matrix region $\hat{1}$, may be line patterns with a predetermined spacing. When forming the first photoresist patterns 16A, they may be patterned to a ¼ pitch or may be patterned up to a ⅔ pitch in consideration of an etch trimming target in a subsequent process. Furthermore, the first photoresist pattern 16B, which is formed in the first and second peripheral regions $\hat{3}$ and $\hat{4}$, is a pattern corresponding to the peripheral region blocking pattern 14B.

The first line patterns 14A and the peripheral region blocking pattern 14B are formed through an etching process using the first photoresist patterns 16A and 16B as an etch mask. All the first photoresist patterns 16A and 16B may be consumed and removed while forming the first line patterns 14A and the peripheral region blocking pattern 14B. Even though the first photoresist patterns 16A and 16B are consumed, the first silicon oxynitride layer patterns 15A and 15B may serve as an etch mask.

By performing the etching process using the first photoresist patterns 16A and 16B in this way, the first line patterns 14A and the peripheral region blocking pattern 14B, which are transferred with the shapes of the first photoresist patterns 16A and 16B, are formed. Thus, the first line patterns 14A become line patterns and may be patterned to a ¼ pitch.

The first line patterns 14A and the peripheral region blocking pattern 14B serving as mask patterns for etching the hard mask layer 13 may be formed at a first level. With the level indicating a surface level, the first line patterns 14A are formed at a first surface level. Subsequent third line patterns are formed at a second level. The first level and the second level have a height difference between them. The second level is higher than the first level. The first level may be a lower level, and the second level may be an upper level. The first line patterns 14A are lower level line patterns.

Figure 1B:
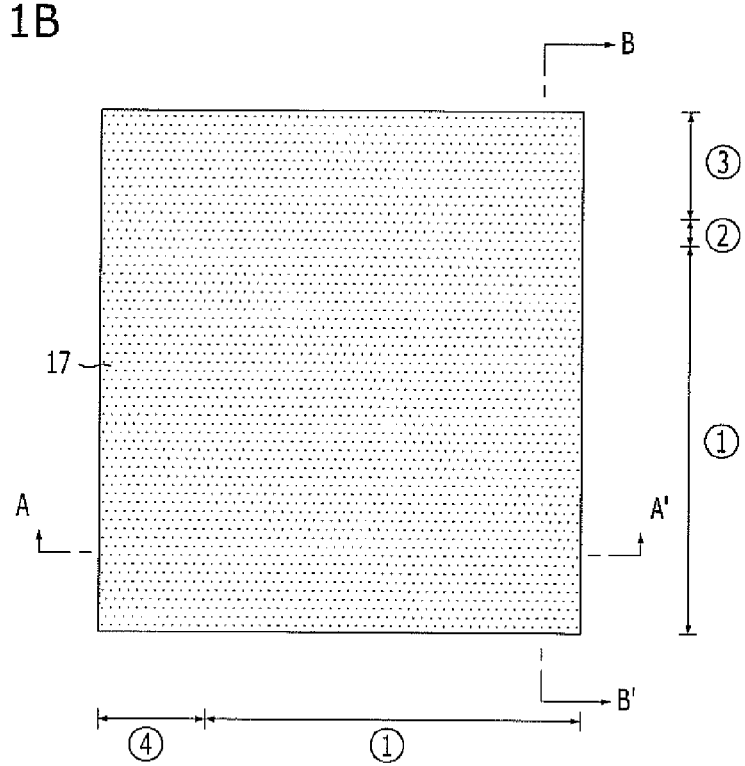
Figure 2B:
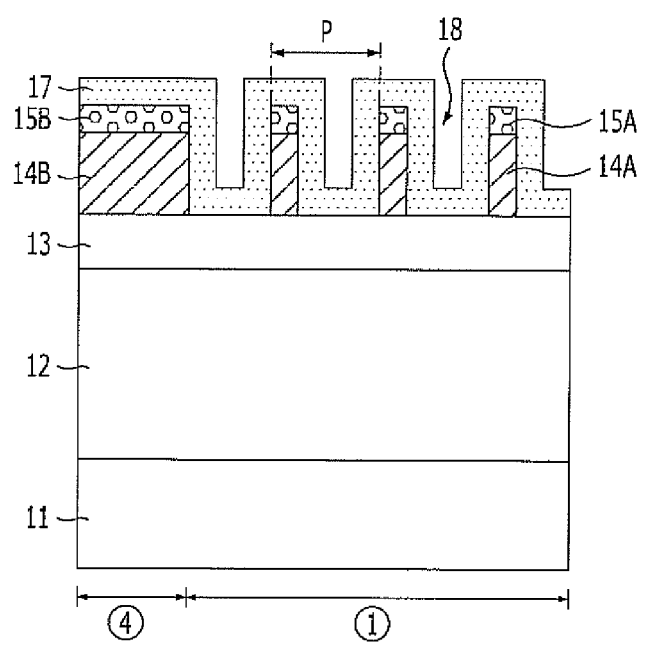
Figure 3B:
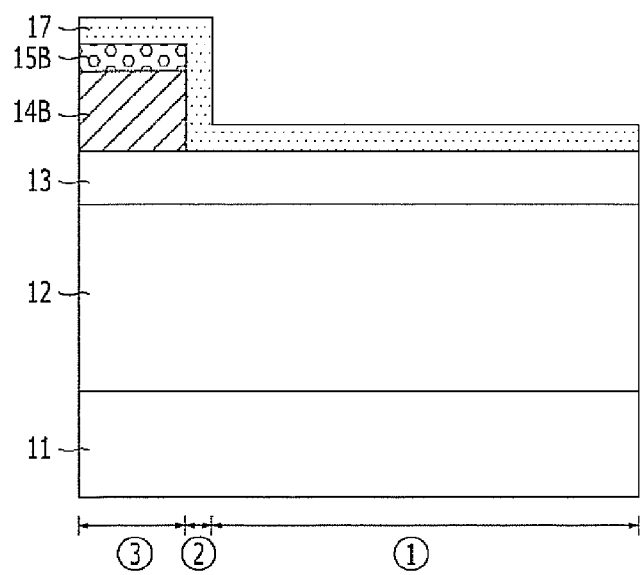

Referring to FIGS. 1B, 2B and 3B, the first photoresist patterns 16A and 16B are removed. The first silicon oxynitride layer patterns 15A and 15B may be removed after removing the first photoresist patterns 16A and 16B.

Then, a sacrificial spacer layer 17 is formed on the entire surface including the first line patterns 14A and the peripheral region blocking pattern 14B. The thickness of the sacrificial spacer layer 17 is set to a ¼ pitch. The sacrificial spacer layer 17 may be formed of a substance having an etching selectivity difference from the first line patterns 14A and the peripheral region blocking pattern 14B. The sacrificial spacer layer 17 may be formed using a dielectric layer. For example, the sacrificial spacer layer 17 may be formed as an oxide layer such as an ultra-low temperature oxide (ULTO). When assuming that a pitch has a width corresponding to the sum of 1P, 2P, 3P and 4P (1P=2P=3P=4P), the 1P may be defined by the first line pattern 14A, and the 2P and 3P may be defined by the sacrificial spacer layer 17. Accordingly, after the sacrificial spacer layer 17 is formed, a gap 18 having a same width as the 3P is defined. The line width of the first line pattern 14A and the thickness of the sacrificial spacer layer 17 may be the same with each other.

By forming the sacrificial spacer layer 17, a first etch mask is formed. In other words, the first etch mask includes the plurality of first line patterns 14A and the sacrificial spacer layer 17, which covers the plurality of first line patterns 14A.

The series of processes described above are negative SPT (NSPT) processes. As will be described later, the sacrificial spacer layer 17 is removed in a subsequent etching process, and the first line patterns 14A serve as an etch mask.

Figure 1C:
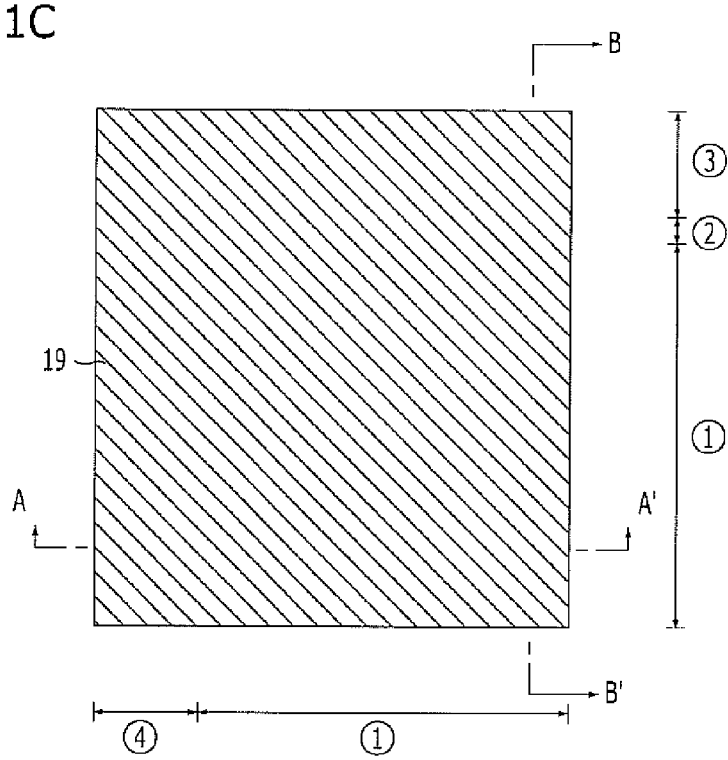
Figure 2C:
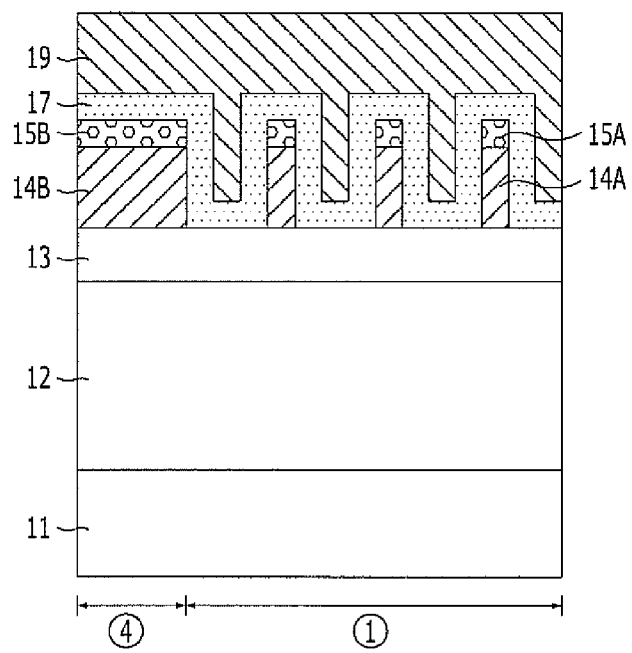
Figure 3C:
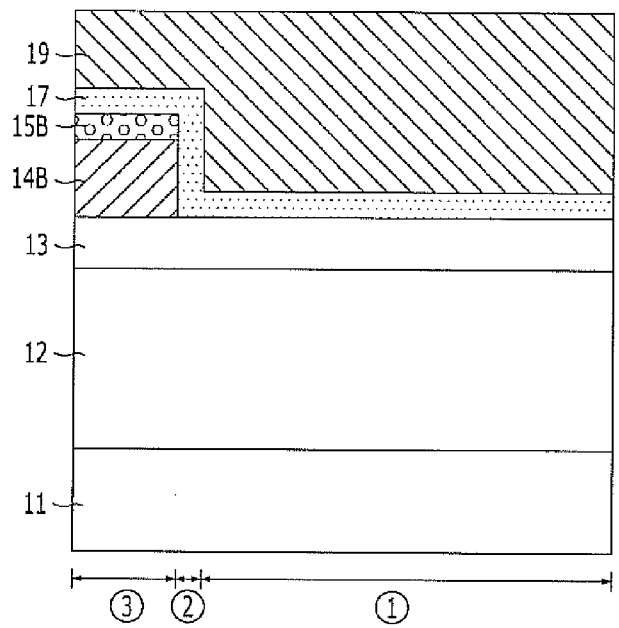

Referring to FIGS. 1C, 2C and 3C, a planarization layer 19 is formed on the sacrificial spacer layer 17. The planarization layer 19 may be formed while filling the gaps 18 defined between portions of the sacrificial spacer layer 17. The planarization layer 19 may be formed through spin-on coating. The planarization layer 19 may include a carbon-containing layer. For example, the planarization layer 19 may include spin-on carbon (SOC) formed through spin-on coating. The planarization layer 19 is formed to a thickness capable of filling the gaps 18, which are defined in the sacrificial spacer layer 17 between the first line patterns 14A. By forming the planarization layer 19 through spin-on coating, the gaps between the first line patterns 14A may be filled without voids. Moreover, the planarization layer 19 may be used as mask patterns for etching the hard mask layer 13 and the sacrificial spacer layer 17. Alternate to the carbon-containing layer 19, the planarization layer 19 may use a substance having an etching selectivity with respect to the hard mask layer 13 and the sacrificial spacer layer 17. The planarization layer 19 may be formed of a substance that is the same as or different from the first line patterns 14A. For example, the planarization layer 19 and the first line patterns 14A may include a carbon-containing layer. Alternately, the planarization layer 19 may include a polysilicon layer, and the first line patterns 14A may include a carbon-containing layer.

Figure 1D:
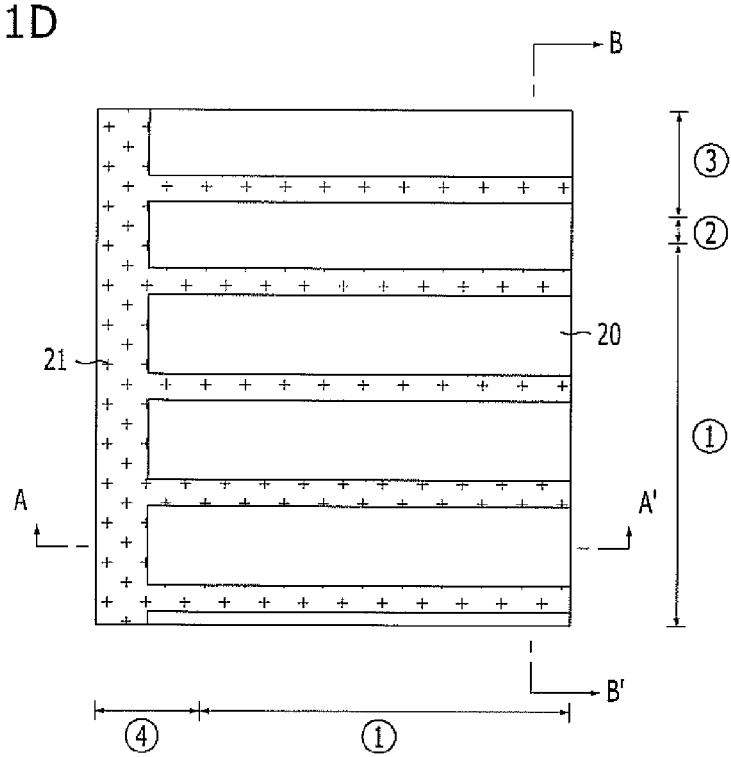
Figure 2D:
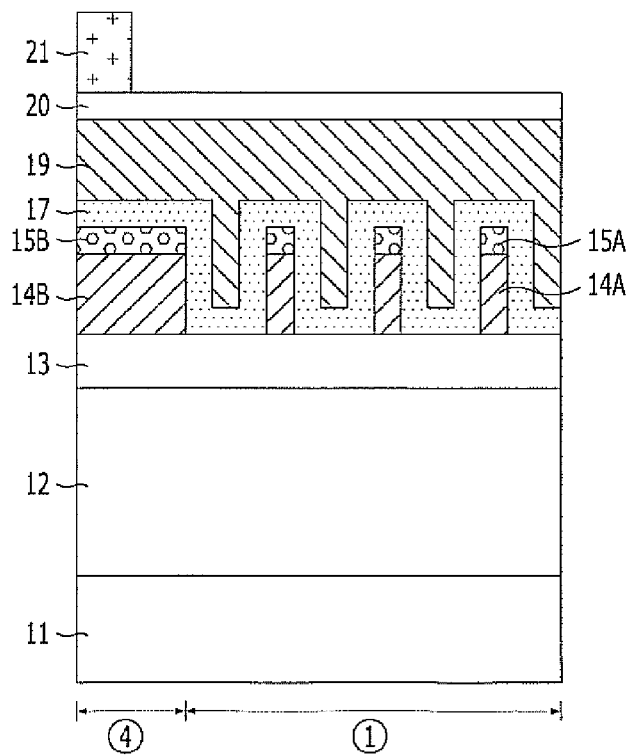
Figure 3D:
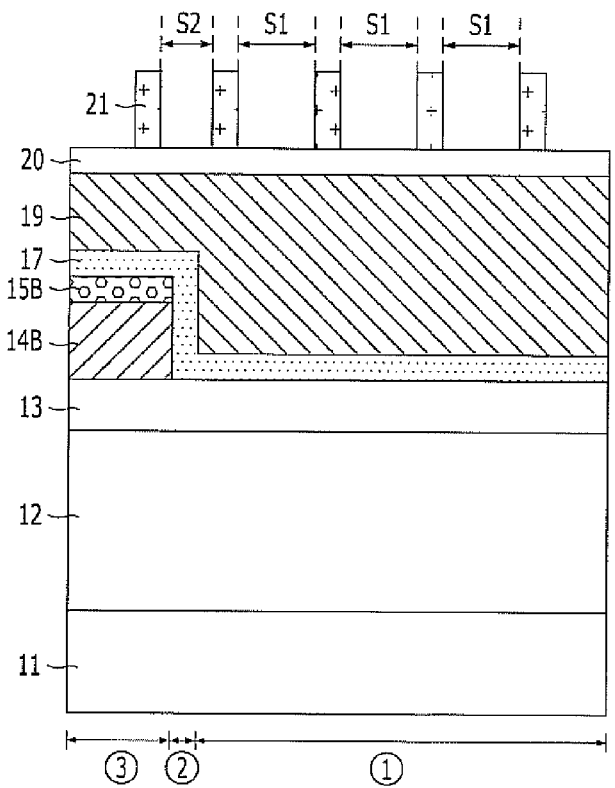

Referring to FIGS. 1D, 2D and 3D, after forming a second silicon oxynitride layer 20 on the planarization layer 19, second photoresist patterns 21 are formed on the second silicon oxynitride layer 20. The second photoresist patterns 21 are line patterns extending in a direction crossing with the first photoresist patterns 16A. The second photoresist patterns 21 may be patterned to a ¼ pitch or may be patterned up to a ⅔ pitch in consideration of an etch trimming target in a subsequent process. The second silicon oxynitride layer 20 may be used as a mask for etching the planarization layer 19. Alternate to the second silicon oxynitride layer 20, a substance with an etching selectivity with respect to the planarization layer 19 may be used. While not shown, an anti-reflective layer may be additionally formed on the second silicon oxynitride layer 20. The anti-reflective layer serves to prevent exposure characteristics from deteriorating due to scattered reflection while forming the second photoresist patterns 21. The anti-reflective layer may include a BARC (bottom anti-reflective coating). In the case where the second silicon oxynitride layer 20 can perform a function of preventing scattered reflection, the anti-reflective layer may be omitted.

The second photoresist patterns 21 are a sacrificial substance that is removed after subsequently forming spacers. Therefore, the second photoresist patterns 21 may be referred to as 'sacrificial line patterns'. The second photoresist patterns 21 may include a plurality of lines, where one end of each of the lines may be coupled with other ends of the lines. The coupled ends may be positioned in the second peripheral region 4. The lines of the second photoresist patterns 21 may have the same line width and may be formed with a first spacing in the cell matrix region $\hat{1}$. For example, the lines formed in the cell matrix region $\hat{1}$ may have a first spacing S1 corresponding to a ¾ pitch. The line formed in the cell matrix edge region $\hat{2}$ may be formed with a second spacing S2 corresponding to a ⅔ pitch. The second spacing S2 may be narrower than the first spacing S1. The second spacing S2 is set to a size equal to or less than the ⅔ pitch. With such spacing, a portion lying under the second spacing S2 corresponds to the cell matrix edge region $\hat{2}$, and a spacer layer is subsequently gap-filled in the second spacing S2. As the spacer layer is gap-filled in the cell matrix edge region $\hat{2}$, the underlying sacrificial spacer layer 17 is protected from a subsequent etching process.

Figure 1E:
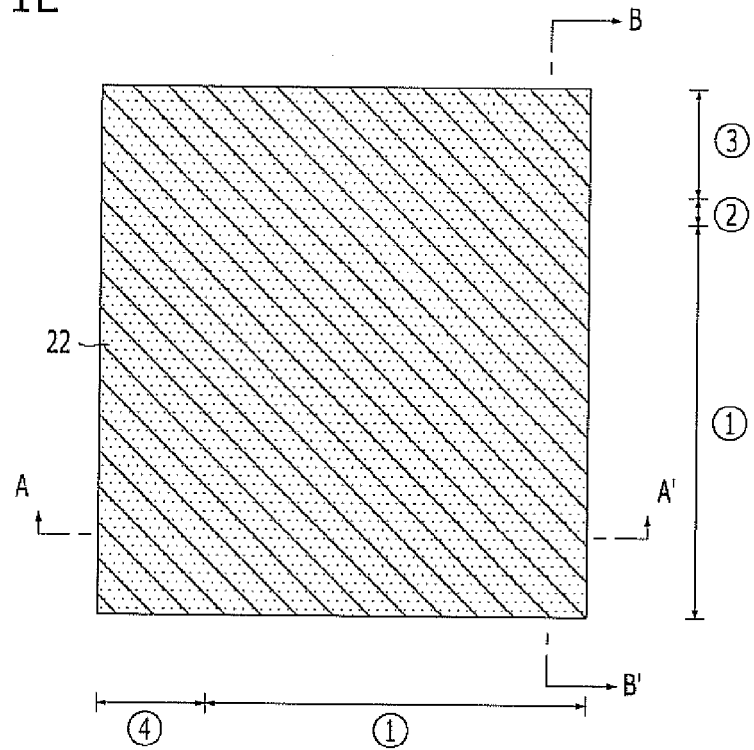
Figure 2E:
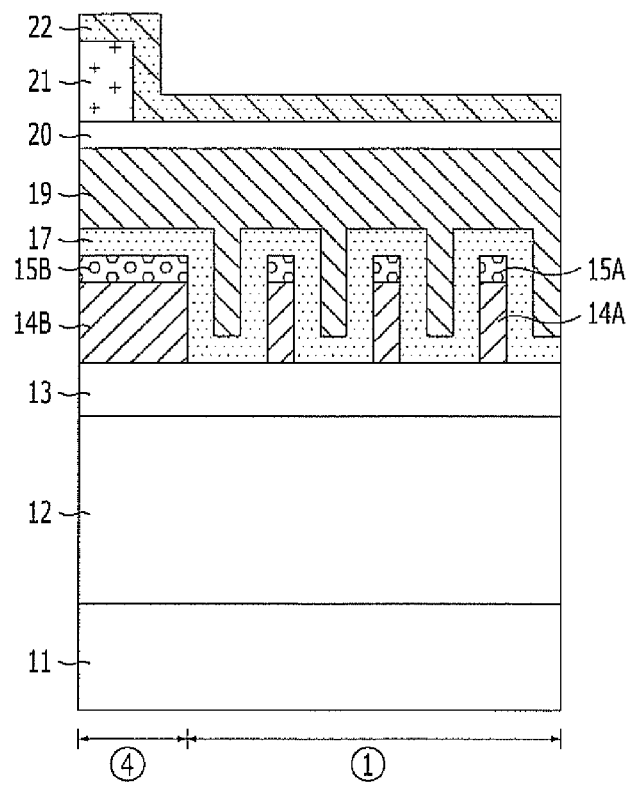
Figure 3E:
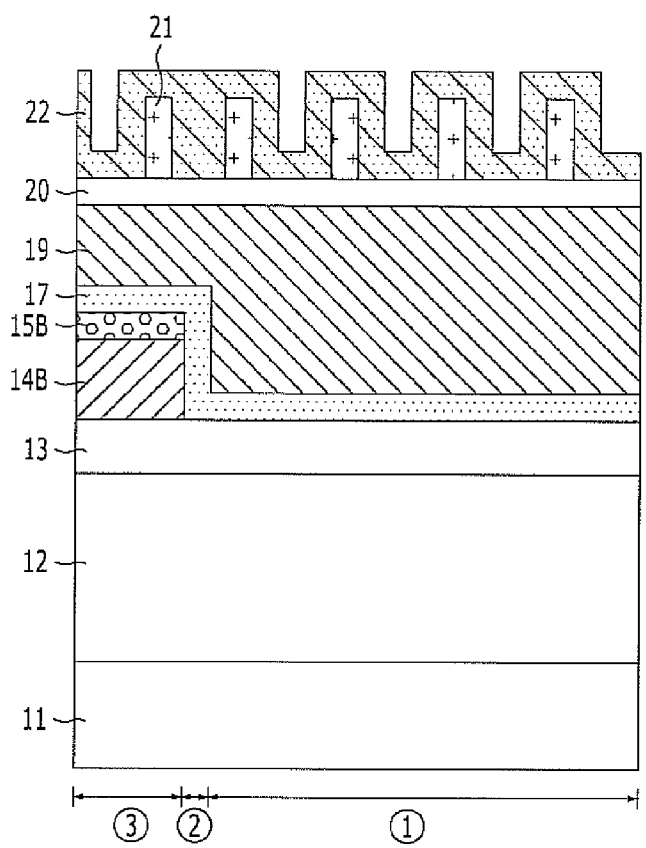

Referring to FIGS. 1E, 2E and 3E, a spacer layer 22 is formed on the entire surface including the second photoresist patterns 21. When forming the spacer layer 22, the spacer layer 22 is formed in the cell matrix region $\hat{1}$ in such a way as to define gaps between the sidewalls of the second photoresist patterns 21 and is formed in the cell matrix edge region $\hat{2}$ in such a way as to fill the second spacing of the second photoresist patterns 21. The thickness of the spacer layer 22 is set to a ¼ pitch. The spacer layer 22 may be formed of a substance having an etching selectivity difference from the second photoresist patterns 21. The spacer layer 22 may be formed using a dielectric layer. For example, the spacer layer 22 may be formed as an oxide layer such as an ultra-low temperature oxide (ULTO). When assuming that a pitch has a width corresponding to the sum of 1P, 2P, 3P and 4P (1P=2P=3P=4P), the 1P may be defined by the second photoresist pattern 21, and the 2P and 3P may be defined by the spacer layer 22. Accordingly, after the spacer layer 22 is formed, a gap having a same width as the 3P is defined.

Figure 1F:
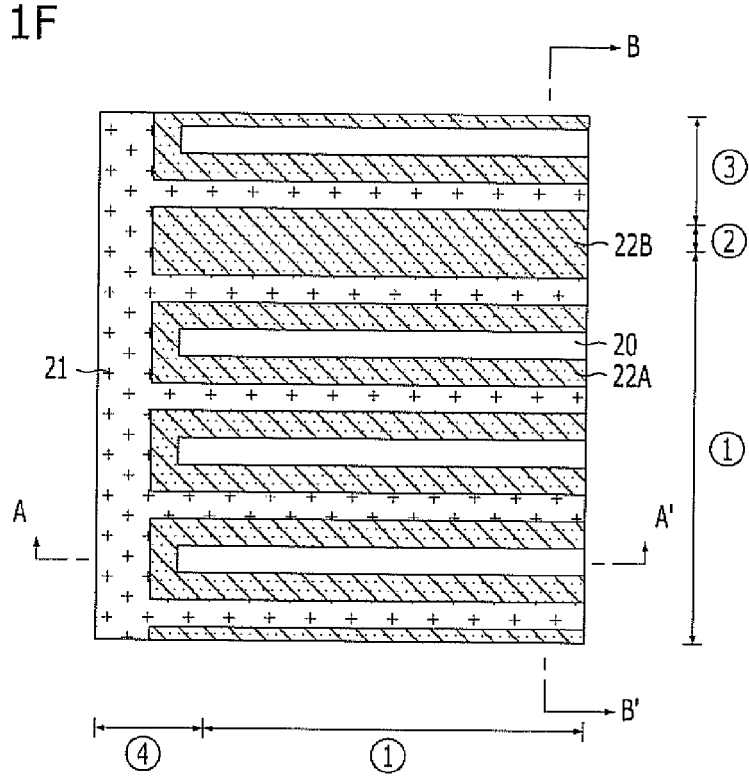
Figure 2F:
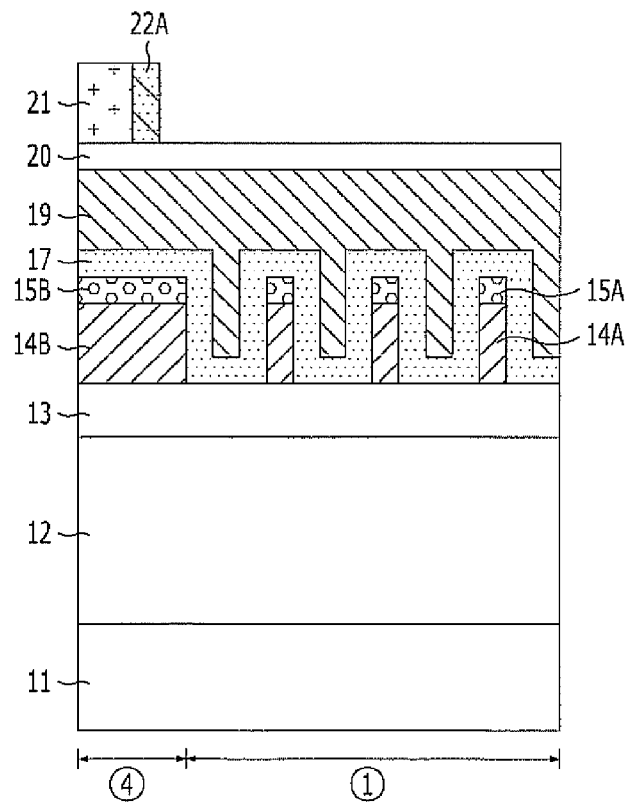
Figure 3F:
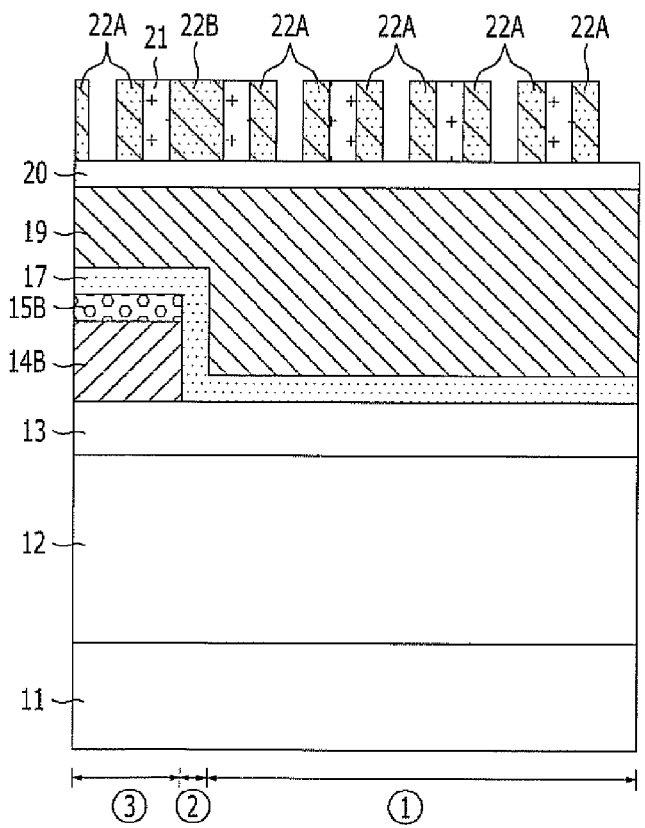

Referring to FIGS. 1F, 2F and 3F, by etching back the spacer layer 22, spacer patterns 22A are formed on both sidewalls of the respective second photoresist patterns 21. The spacer patterns 22A have line shapes. The plurality of spacer patterns 22A are arranged in the direction crossing with the first line patterns 14A. Each spacer pattern 22A may have a shape formed by coupling two lines. When forming the spacer patterns 22A, a blocking line 22B which blocks the cell matrix edge region 2̂ is formed. The blocking line 22B is formed by the spacer layer 22 which is filled in the second spacing of the second photoresist patterns 21.

Figure 1G:
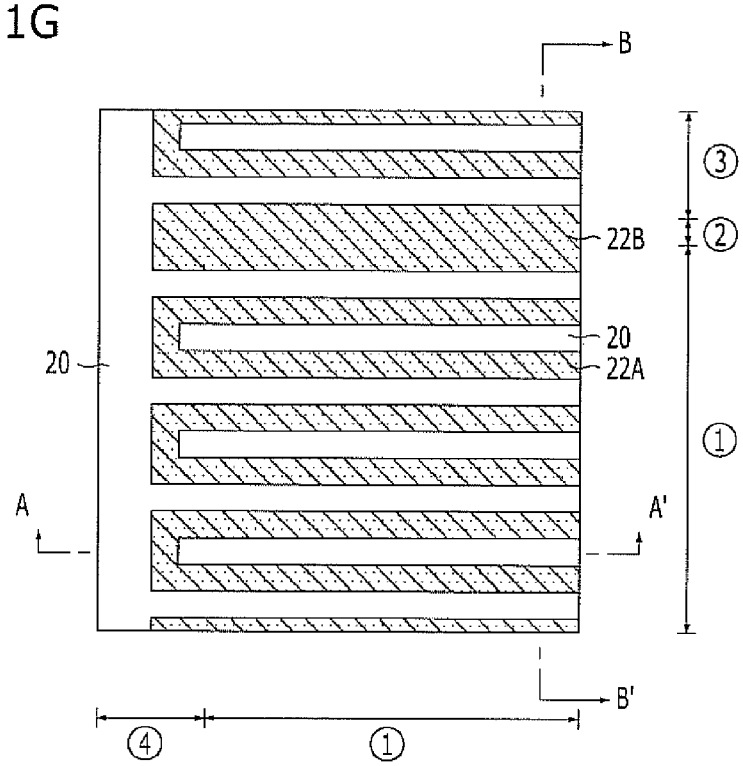
Figure 2G:
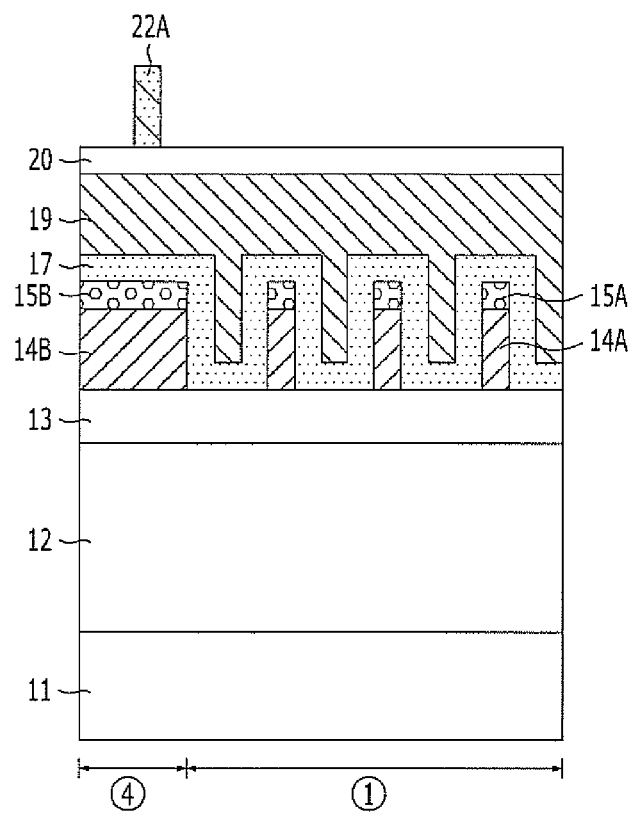
Figure 3G:
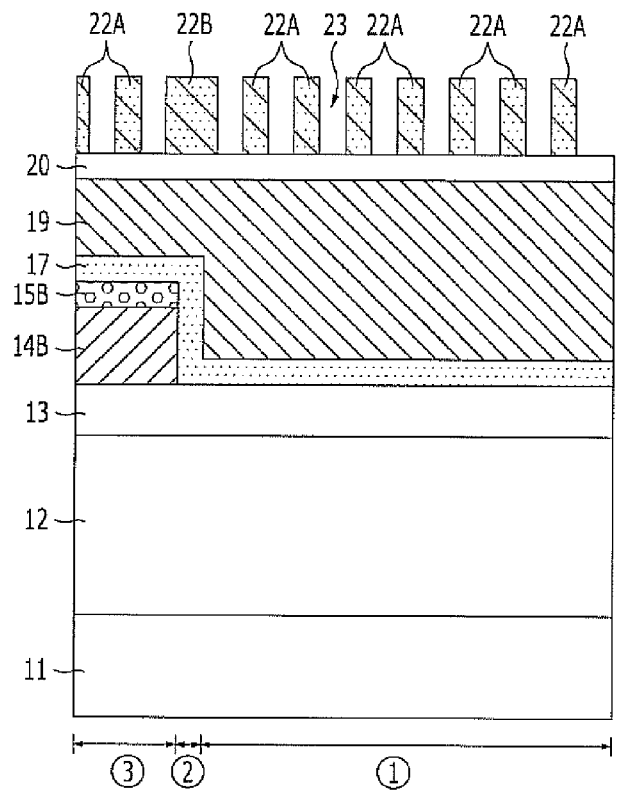

Referring to FIGS. 1G, 2G and 3G, the second photoresist patterns 21 are removed. Thus, the second silicon oxynitride layer 20 is exposed between the plurality of spacer patterns 22A.

As the spacer patterns 22A and the blocking line 22B are formed as described above, the spacer patterns 22A are disposed over the first line patterns 14A with the planarization layer 19 interposed therebetween. The spacer patterns 22A are formed in the cell matrix region 1̂. The blocking line 22B is formed in the cell matrix edge region 2̂.

The spacer patterns 22A are a substance used as an etch mask in a subsequent etching process. This is referred to as a positive SPT (PSPT) process.

Figure 1H:
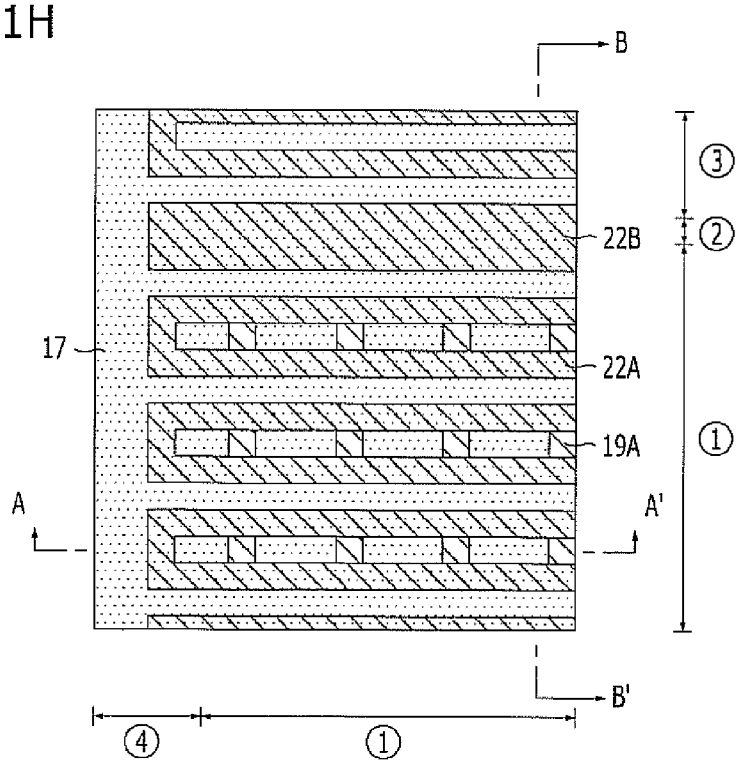
Figure 1J:
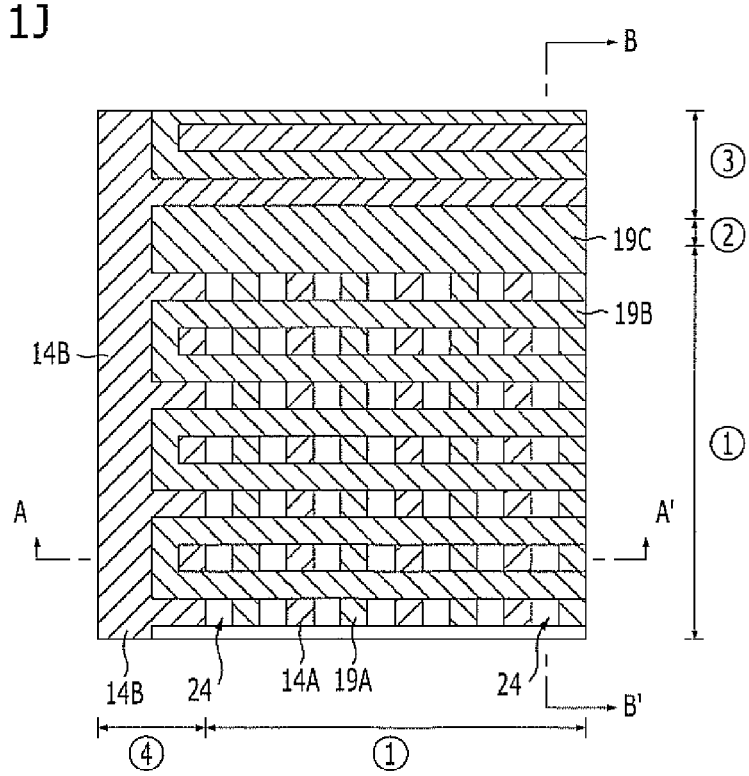
Figure 2H:
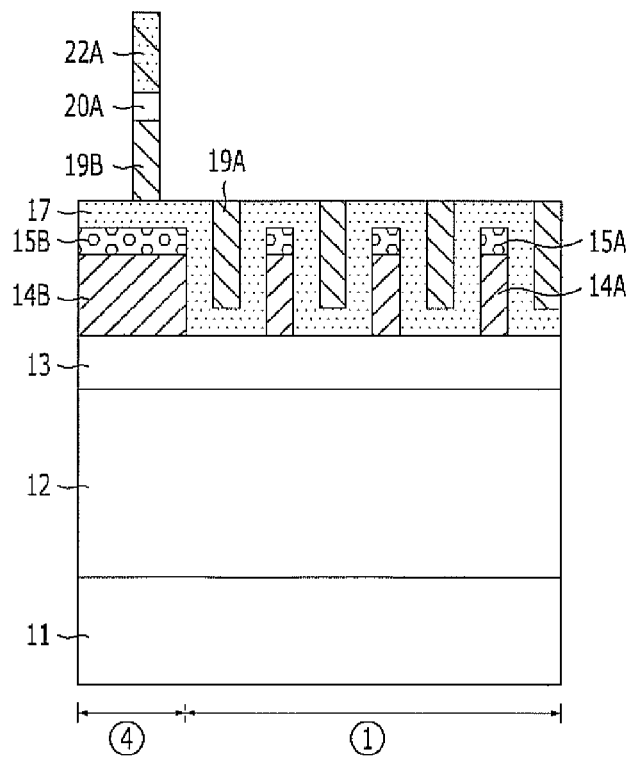
Figure 3H:
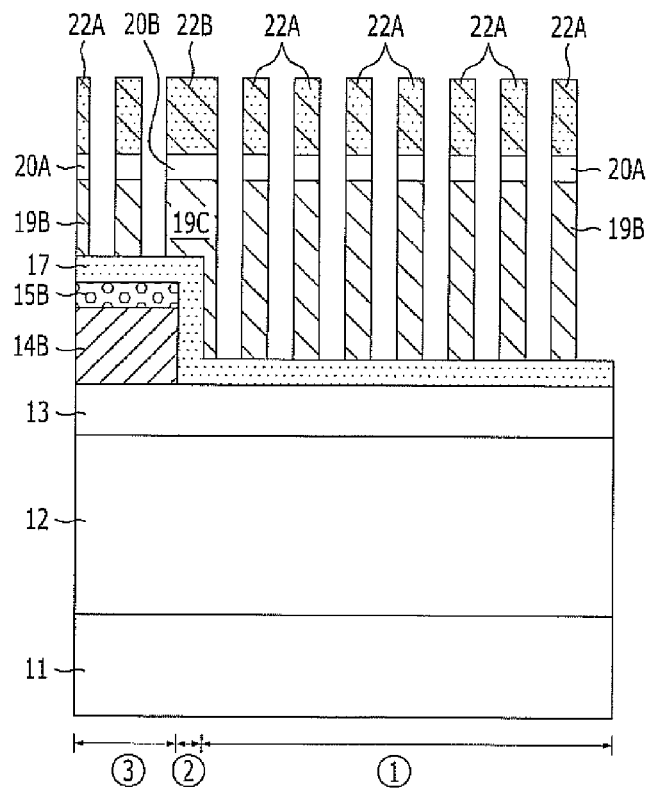

Referring to FIGS. 1H, 2H and 3H, underlying substances are etched using the spacer patterns 22A and the blocking line 22B as an etch mask. First, the second silicon oxynitride layer 20 and the planarization layer 19 are etched using the spacer patterns 22A and the blocking line 22B as an etch mask. Etching is stopped at the sacrificial spacer layer 17 when etching the planarization layer 19. Consequently, second line patterns 19A may be formed between the first line patterns 14A, and third line patterns 19B, which are transferred with the shapes of the spacer patterns 22A, may be formed. The second line patterns 19A may be formed between the first line patterns 14A and extend parallel to the first line patterns 14A. The second line patterns 19A and the third line patterns 19B are coupled with each other in a crossing pattern, and accordingly, a mesh type pattern structure may be obtained. As the planarization layer 19 is etched using the blocking line 22B, a blocking pattern 19C (FIG. 1J) is formed. The blocking pattern 19C covers the cell matrix edge region 2̂. Second silicon oxynitride layer patterns 20A and 20B are respectively formed on the third line patterns 19B and the blocking pattern 19C.

The first line patterns 14A and the third line patterns 19B extend in directions crossing with each other. The third line patterns 19B extend in the direction which also crosses with the second line patterns 19A. The sacrificial spacer layer 17 is exposed between the first line patterns 14A and the second line patterns 19A.

By etching the planarization layer 19 as described above, a second etch mask is formed. The second etch mask includes a mesh type pattern and the blocking pattern 19C. The mesh type pattern has a structure which is formed through coupling of the second line patterns 19A and the third line patterns 19B. The mesh type pattern is formed in the cell matrix region 1̂.

Figure 1I:
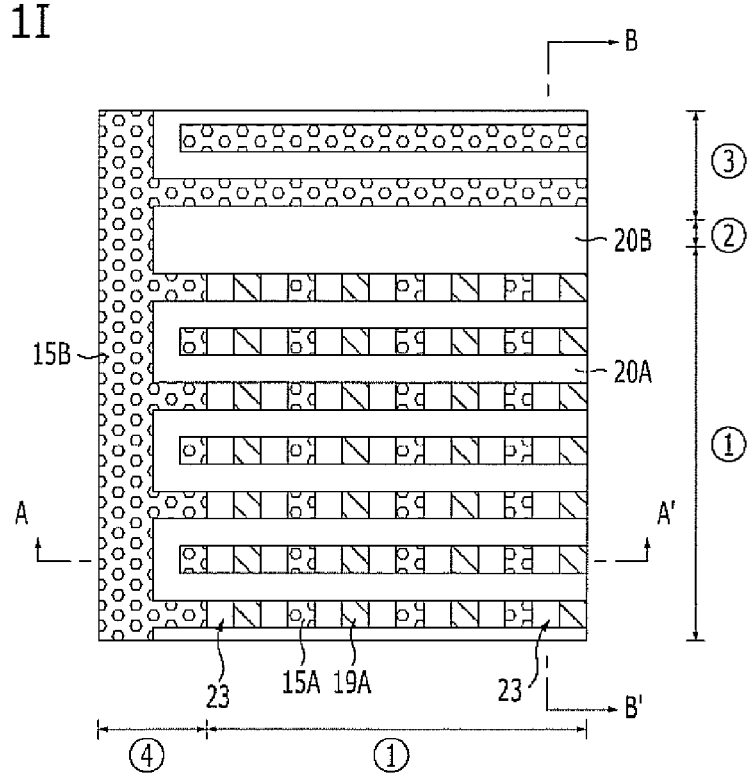
Figure 2I:
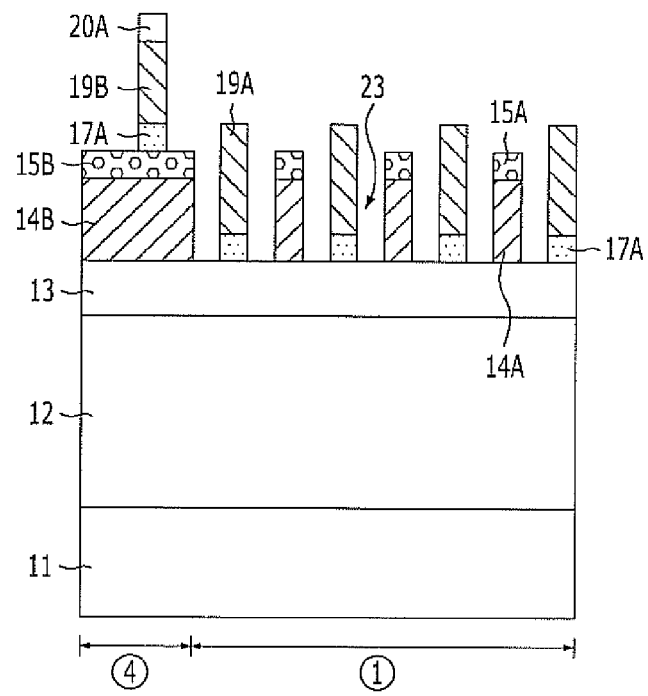
Figure 3I:
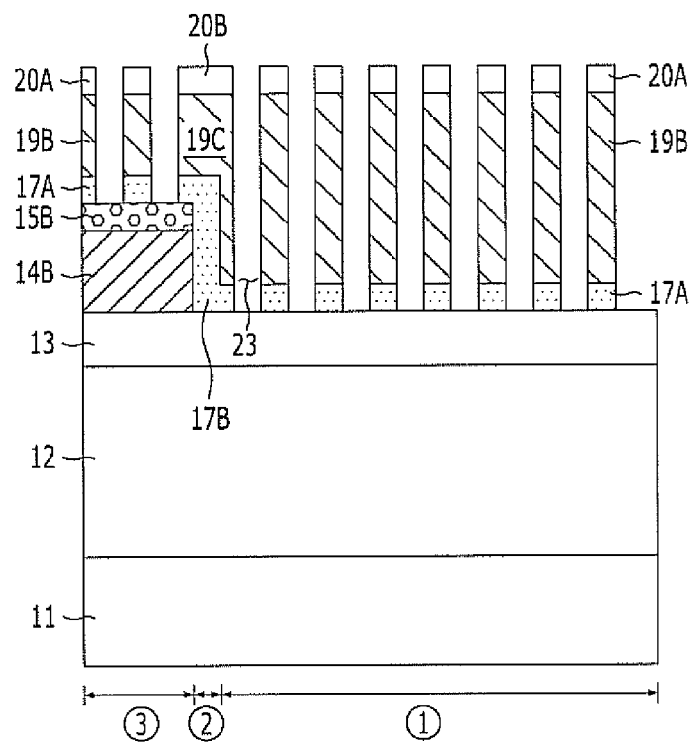

Referring to FIGS. 1I, 2I and 3I, exposed portions of the sacrificial spacer layer 17 are etched. Thus, the sacrificial spacer layer 17 is removed between the first line patterns 14A and the second line patterns 19A. Sacrificial spacer layer patterns 17A may remain under the second line patterns 19A. The sacrificial spacer layer 17 may be removed using the third line patterns 19B as an etch mask. Furthermore, the first line patterns 14A and the second line patterns 19A may be used as an etch mask. When etching the sacrificial spacer layer 17, all the spacer patterns 22A and the blocking line 22B as an oxide layer substance may be consumed and not remain. The first silicon oxynitride layer patterns 15A and 15B on the first line patterns 14A may be exposed. Even though the spacer patterns 22A and the blocking line 22B are consumed, the first to third line patterns 14A, 19A and 19B may serve as an etch mask. By selectively etching the sacrificial spacer layer 17, openings 23 are defined by a mesh type structure which includes the first line patterns 14A, the second line patterns 19A and the third line patterns 19B. The openings 23 may have hole shapes.

As the sacrificial spacer layer 17 is removed according to the above-described series of processes, a mask pattern for etching the underlying hard mask layer 13 is completed. The mask pattern includes a plurality of lower level line patterns and a plurality of upper level line patterns. The lower level line patterns include the first line patterns 14A and the second line patterns 19A. The upper level line patterns include the third line patterns 19B. The first line patterns 14A and the second line patterns 19A may be alternately disposed. The third line patterns 19B are coupled with the second line patterns 19A in a crossing pattern and extend over the second line patterns 19A in the direction crossing with the first line patterns 14A. A spacing between the first line pattern 14A and the second line pattern 19A may be the same with a spacing between the third line patterns 19B. The second line patterns 19A and the third line patterns 19B may be formed in the vertical direction and may form a mesh type pattern. The sacrificial spacer layer patterns 17A may remain under the second line patterns 19A. A sacrificial spacer layer pattern 17B may also remain under the blocking pattern 19C. The sacrificial spacer layer pattern 17B blocks the cell matrix edge region 2̂ in a subsequent etching process.

As a consequence, in the first embodiment, a mask pattern for etching the hard mask layer 13 may be formed by sequentially applying an NSPT process and a PSPT process. In addition, it is not necessary to separately adopt the periphery-close mask (PCM) which covers the peripheral region. Namely, the blocking pattern 19C for covering the cell matrix edge region 2̂ is formed in a self-aligned manner.

Figure 2J:
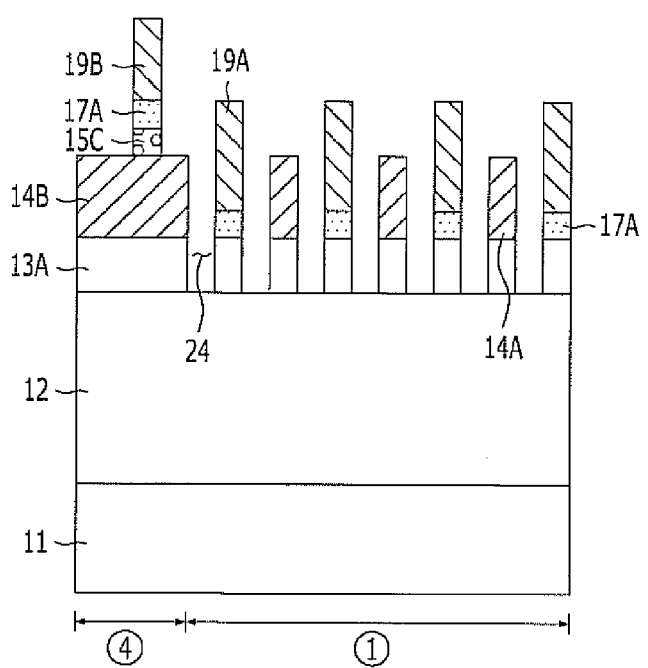
Figure 3J:
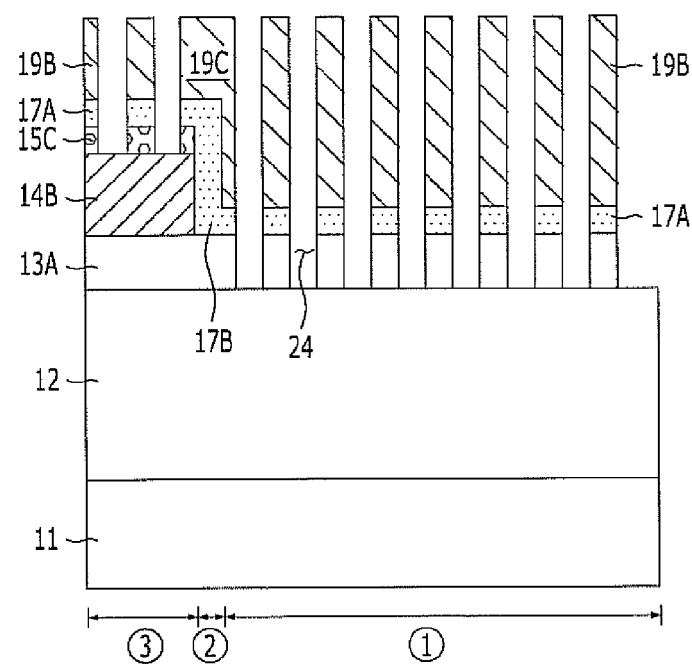

Referring to FIGS. 1J, 2J and 3J, the hard mask layer 13 is etched using the first line patterns 14A, the second line patterns 19A, the third line patterns 19B and the blocking pattern 19C as an etch mask. Thus, hard mask layer patterns 13A with a plurality of holes 24 are formed. The holes 24 defined in the hard mask layer patterns 13A may have a matrix arrangement. The holes 24 are regularly arranged and are not defined in the cell matrix edge region 2̂ due to the presence of the blocking pattern 19C. When etching the hard mask layer 13, the second silicon oxynitride layer patterns 20A and 20B and the first silicon oxynitride layer patterns 15A and 15B may be consumed and removed in the cell matrix region 1̂. A first silicon oxynitride layer pattern 15C may remain in the first and second peripheral regions 3̂ and 4̂.

Figure 1K:
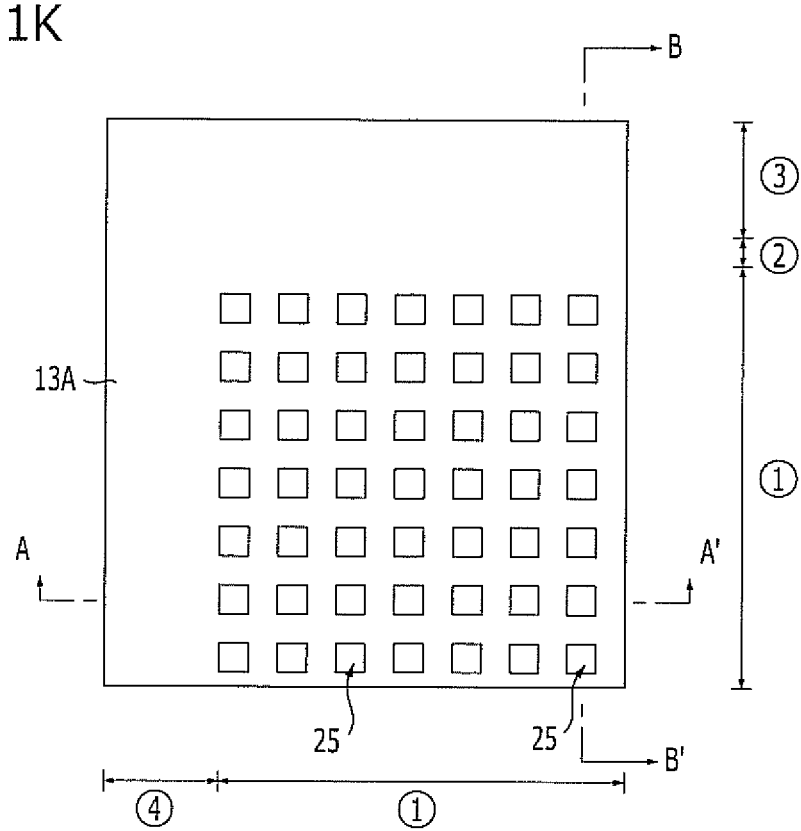
Figure 2K:
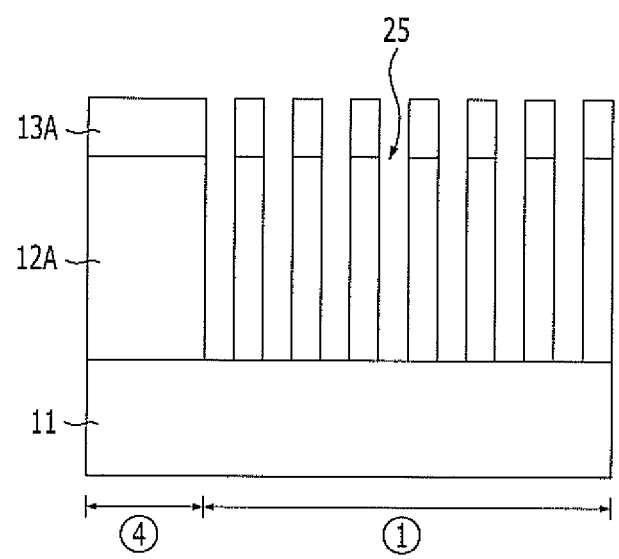
Figure 3K:
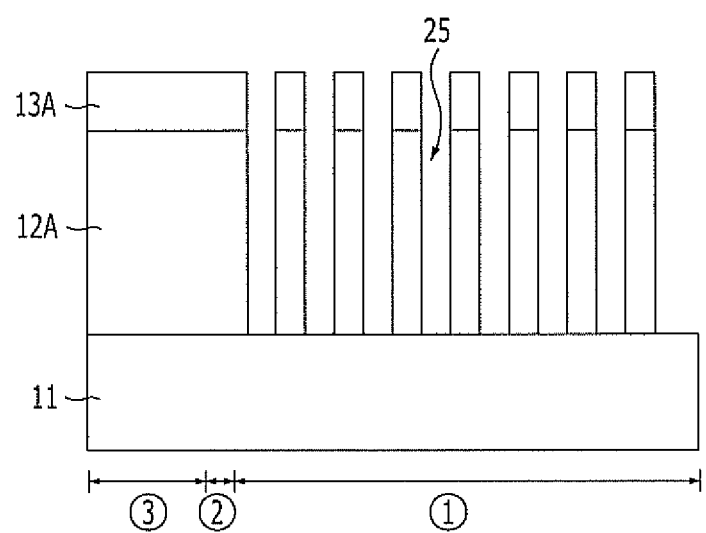

Referring to FIGS. 1K, 2K and 3K, all the first line patterns 14A, the second line patterns 19A, the third line patterns 19B and the blocking pattern 19C are removed. When the hard mask layer patterns 13A have the multi-layered structure, the multiple layers of the hard mask layer 13 may be sequentially etched. During such an etching process, the first silicon oxynitride layer pattern 15C and the sacrificial spacer layer patterns 17A and 17B may be removed.

Next, the etching target layer 12 is etched using the hard mask layer patterns 13A as an etch mask. Thus, a plurality of hole patterns 25 are defined in etching target layer patterns 12A. The hole patterns 25 are defined in the cell matrix region 1̂ and are not defined in the cell matrix edge region 2̂ and the first and second peripheral regions 3̂ and 4̂.

FIGS. 4A to 4L are plan views showing a method for fabricating a semiconductor device in accordance with a second embodiment of the present invention. FIGS. 5A to 5L are cross-sectional views taken along the lines A-A' of FIGS. 4A to 4L, respectively. FIGS. 6A to 6L are cross-sectional views taken along the lines B-B' of FIGS. 4A to 4L, respectively.

Figure 4A:
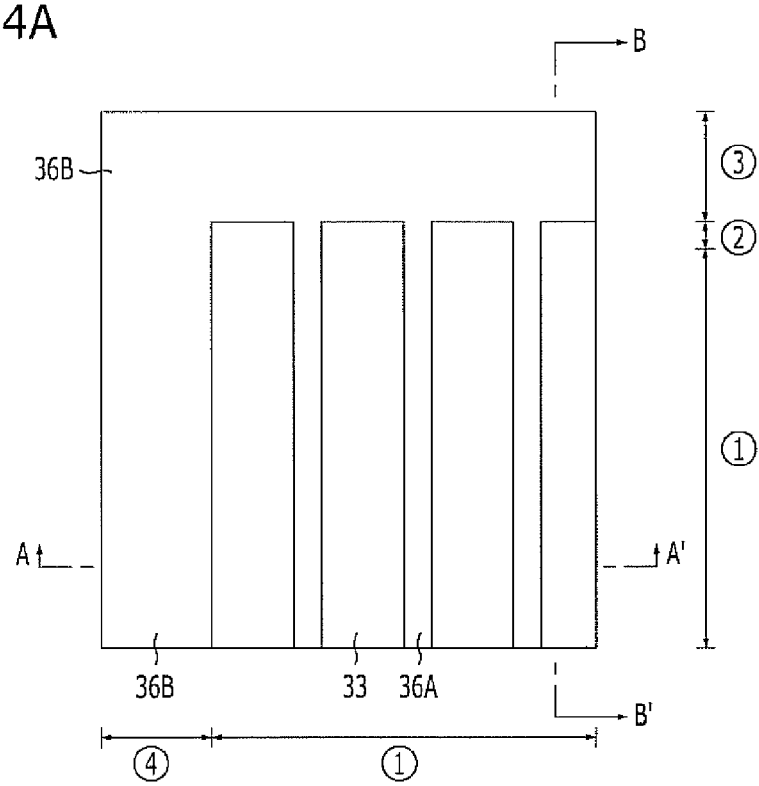
FIGS. 4A to 4L are plan views showing a method for fabricating a semiconductor device in accordance with a second embodiment of the present invention.
Figure 5A:
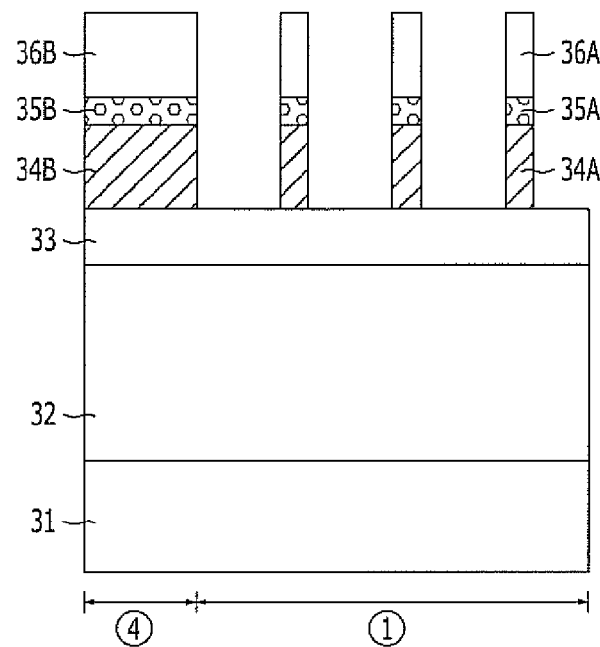
FIGS. 5A to 5L are cross-sectional views taken along the lines A-A' of FIGS. 4A to 4L, respectively.
Figure 6A:
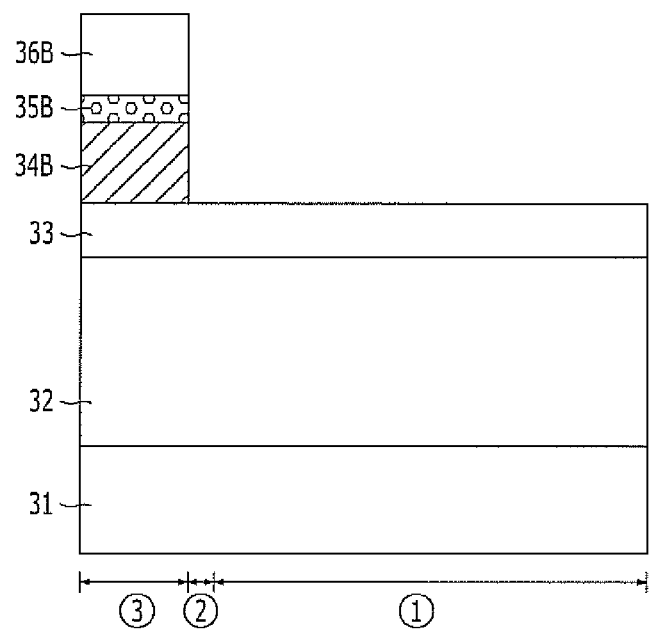
FIGS. 6A to 6L are cross-sectional views taken along the lines B-B' of FIGS. 4A to 4L, respectively.

Referring to FIGS. 4A, 5A and 6A, an etching target layer 32 is formed on a substrate 31 (FIG. 5A). The substrate 31 may include a first region $\hat{1}$, a second region $\hat{2}$, a third region $\hat{3}$ and a fourth region $\hat{4}$. The first region $\hat{1}$ is a region where a plurality of holes are to be subsequently defined. The third region $\hat{3}$ and the fourth region $\hat{4}$ are regions where holes are not defined. The second region $\hat{2}$ is a boundary region between the first region $\hat{1}$ and the third region $\hat{3}$ and is an edge region of the first region $\hat{1}$. The first region $\hat{1}$ may include a cell matrix region, and the third region $\hat{3}$ and the fourth region $\hat{4}$ may include peripheral regions. The second region $\hat{2}$ may include a cell matrix edge region. Hereinbelow, in the second embodiment, the first region $\hat{1}$ will be referred to as a 'cell matrix region', the third region $\hat{3}$ will be referred to as a 'first peripheral region', the second region $\hat{2}$ will be referred to as a 'cell matrix edge region', and the fourth region $\hat{4}$ will be referred to as a 'second peripheral region'.

The etching target layer 32 may include various substances. For example, the etching target layer 32 may include an oxide layer, a nitride layer, a silicon layer or a metal layer. Hereinbelow, in the second embodiment, the etching target layer 32 may include an oxide layer. A hard mask layer 33 serves as an etch mask in etching the etching target layer 32. Accordingly, the hard mask layer 33 and the etching target layer 32 may be formed of substances which have different etching selectivities. The hard mask layer 33 may include a single-layered structure or a multi-layered structure of at least two layers. For example, the hard mask layer 33 may be formed as a single layer selected from a polysilicon layer, an oxide layer and a nitride layer or as a multi-layer by stacking these layers. In the second embodiment, the hard mask layer 33 may be formed by stacking a hard mask polysilicon layer, a hard mask oxide layer and a hard mask nitride layer. In this way, as the hard mask layer 33 having the multi-layered structure is formed by stacking substances with different etching selectivities, respectively, these layers are prevented from being simultaneously etched. Furthermore, by using the hard mask layer 33 with the multi-layered structure, etching with a high aspect ratio is obtained when patterning the etching target layer 32.

A plurality of first line patterns 34A are formed on the hard mask layer 33. The first line patterns 34A extend in a first direction. The first line patterns 34A may be formed in the cell matrix region $\hat{1}$. In addition to the first line patterns 34A, a peripheral region blocking pattern 34B may be formed in the first and second peripheral regions $\hat{3}$ and $\hat{4}$. The first line patterns 34A may be coupled with the peripheral region blocking pattern 34B. That is to say, the first line patterns 34A and the peripheral region blocking pattern 34B may be simultaneously formed. The plurality of first line patterns 34A may be formed with a constant spacing. The first line patterns 34A and the peripheral region blocking pattern 34B may include a carbon-containing layer. According to an example, the carbon-containing layer may include a carbon layer, which may be formed through spin-on coating. The carbon layer formed through spin-on coating in this way is referred to as 'spin-on carbon (SOC)'.

The first line patterns 34A and the peripheral region blocking pattern 34B may be used as a mask for etching the hard mask layer 33. The first line patterns 34A and the peripheral region blocking pattern 34B may be formed using a substance other than the carbon-containing layer, where the substance has an etching selectivity with respect to the hard mask layer 33.

In order to form the first line patterns 34A and the peripheral region blocking pattern 34B, first silicon oxynitride layer patterns 35A and 35B may be used as an etch mask. Alternate to the first silicon oxynitride layer patterns 35A and 35B, a substance with an etching selectivity with respect to the carbon-containing layer may be used.

The first silicon oxynitride layer patterns 35A and 35B may be patterned using first photoresist patterns 36A and 36B. While not shown, an anti-reflective layer may be additionally formed on the first silicon oxynitride layer patterns 35A and 35B. The anti-reflective layer serves to prevent exposure characteristics from deteriorating due to scattered reflection while forming the first photoresist patterns 36A and 36B. The anti-reflective layer may include a BARC (bottom anti-reflective coating). In the case where the first silicon oxynitride layer patterns 35A and 35B can perform a function of preventing scattered reflection, the anti-reflective layer may be omitted.

A plurality of first photoresist patterns 36A, which are formed in the cell matrix region $\hat{1}$, may be line patterns with a predetermined spacing. When forming the first photoresist patterns 36A, they may be patterned to a ¼ pitch or may be patterned up to a ⅔ pitch in consideration of an etch trimming target in a subsequent process. Furthermore, the first photoresist pattern 36B, which is formed in the first and second peripheral regions $\hat{3}$ and $\hat{4}$, is a pattern corresponding to the peripheral region blocking pattern 34B.

The first line patterns 34A and the peripheral region blocking pattern 34B are formed through an etching process using the first photoresist patterns 36A and 36B as an etch mask. All the first photoresist patterns 36A and 36B may be consumed and removed while forming the first line patterns 34A and the peripheral region blocking pattern 34B. Even though the first photoresist patterns 36A and 36B are consumed, the first silicon oxynitride layer patterns 35A and 35B may serve as an etch mask.

By performing the etching process using the first photoresist patterns 36A and 36B in this way, the first line patterns 34A and the peripheral region blocking pattern 34B, which are transferred with the shapes of the first photoresist patterns 36A and 36B are formed. Thus, the first line patterns 34A become line patterns and may be patterned to a ¼ pitch.

The first line patterns 34A and the peripheral region blocking pattern 34B serving as mask patterns for etching the hard mask layer 33 may be formed at a first level. With the level indicating a surface level, the first line patterns 34A are formed at a first surface level. Subsequent third line patterns are formed at a second level. The first level and the second level have a height difference between them. The second level is higher than the first level. The first level may be a lower level, and the second level may be an upper level. The first line patterns 34A are lower level line patterns.

Figure 4B:
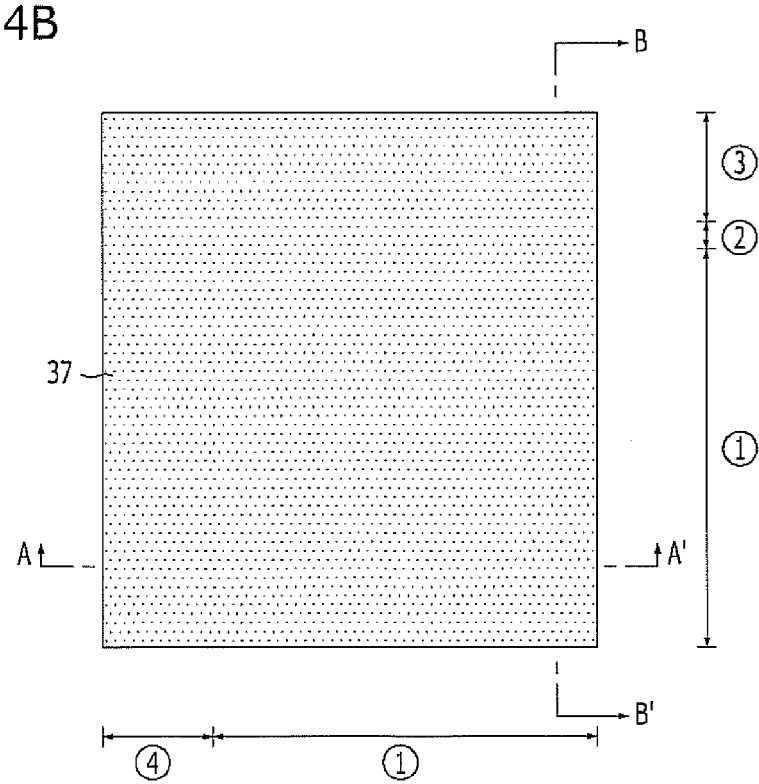
Figure 5B:
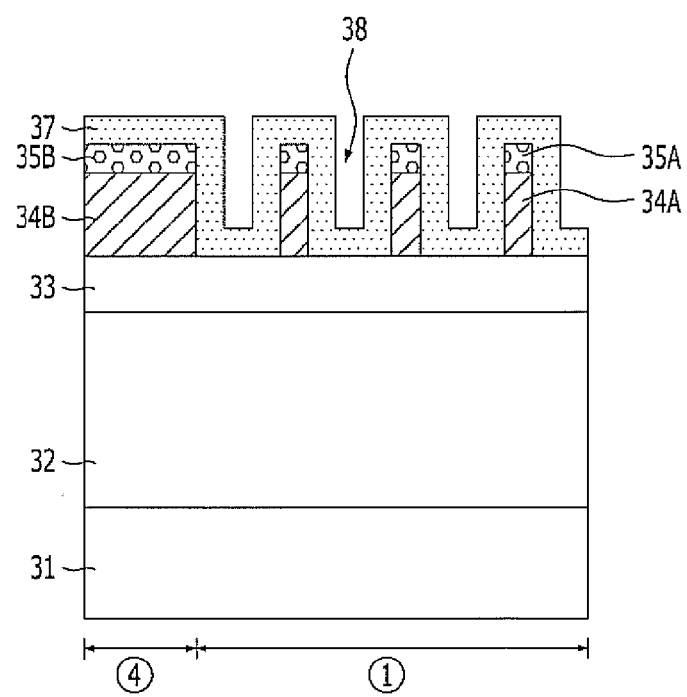
Figure 6B:
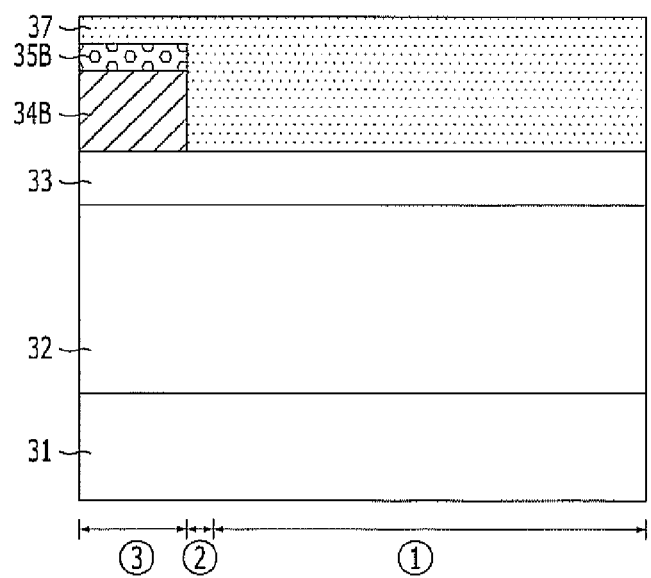

Referring to FIGS. 4B, 5B and 6B, the first photoresist patterns 36A and 36B are removed. The first silicon oxynitride layer patterns 35A and 35B may be removed after removing the first photoresist patterns 36A and 36B.

Then, a sacrificial spacer layer 37 is formed on the entire surface including the first line patterns 34A and the peripheral region blocking pattern 34B. The thickness of the sacrificial spacer layer 37 is set to a ¼ pitch. The sacrificial spacer layer 37 may be formed of a substance having an etching selectivity difference from the first line patterns 34A and the peripheral region blocking pattern 34B. The sacrificial spacer layer 37 may be formed using a dielectric layer. For example, the sacrificial spacer layer 37 may be formed as an oxide layer such as an ultra-low temperature oxide (ULTO). When assuming that a pitch has a width corresponding to the sum of 1P, 2P, 3P and 4P (1P=2P=3P=4P), the 1P may be defined by the first line pattern 34A, and the 2P and 3P may be defined by the sacrificial spacer layer 37. Accordingly, after the sacrificial spacer layer 37 is formed, a gap 38 having a same width as the 3P is defined. The line width of the first line pattern 34A and the thickness of the sacrificial spacer layer 37 may be the same with each other.

By forming the sacrificial spacer layer 37, a first etch mask is formed. In other words, the first etch mask includes the plurality of first line patterns 34A and the sacrificial spacer layer 37, which covers the plurality of first line patterns 34A.

The series of processes described above are negative SPT (NSPT) processes. As will be described later, the sacrificial spacer layer 37 is removed in a subsequent etching process, and the first line patterns 34A serve as an etch mask.

Figure 4C:
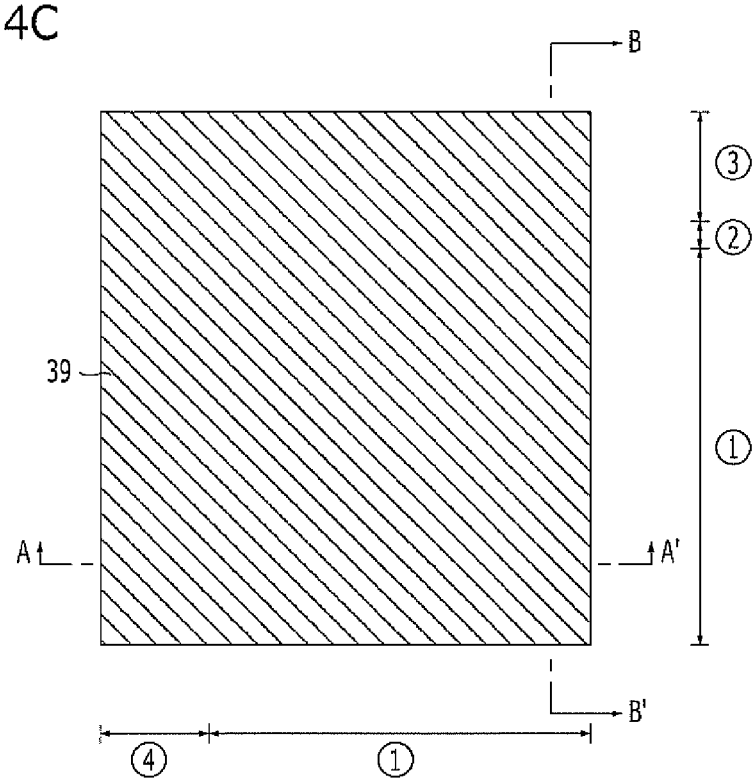
Figure 5C:
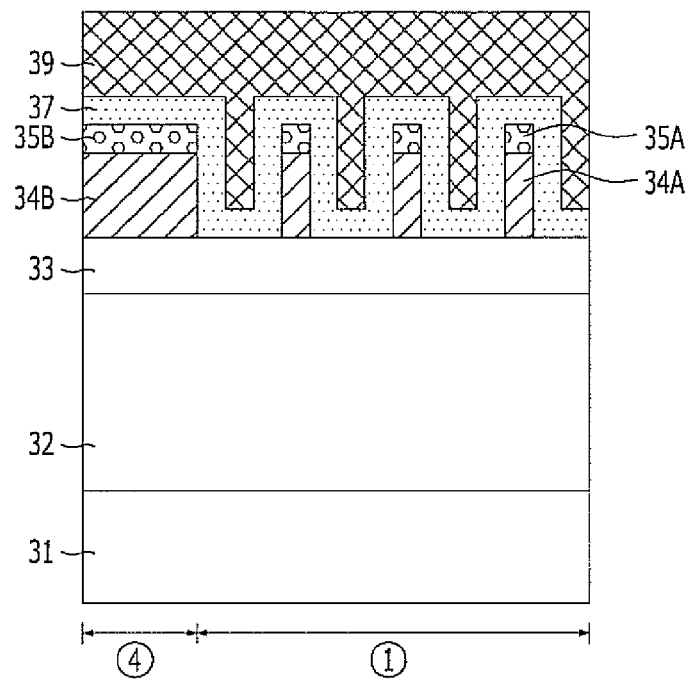
Figure 6C:
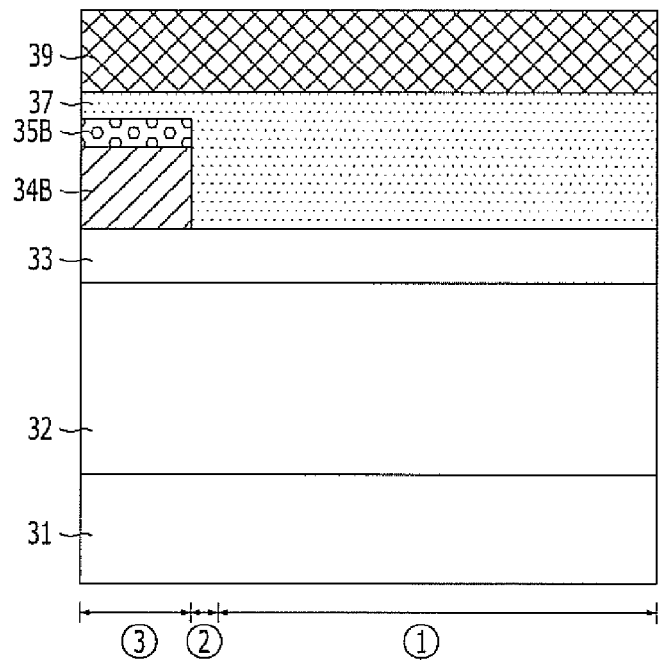

Referring to FIGS. 4C, 5C and 6C, a first planarization layer 39 is formed on the sacrificial spacer layer 37. The first planarization layer 39 may be formed while filling the gaps 38 defined between portions of the sacrificial spacer layer 37. The first planarization layer 39 may be formed through spin-on coating. The first planarization layer 39 may include a carbon-containing layer. For example, the first planarization layer 39 may include spin-on carbon (SOC) formed through spin-on coating. The first planarization layer 39 is formed to a thickness capable of filling the gaps 38 which are defined in the sacrificial spacer layer 37 between the first line patterns 34A. By forming the first planarization layer 39 through spin-on coating, the gaps between the first line patterns 34A may be filled without voids. Moreover, the first planarization layer 39 may be used as mask patterns for etching the hard mask layer 33 and the sacrificial spacer layer 37. Alternate to the carbon-containing layer 39, the first planarization layer 39 may use a substance having an etching selectivity with respect to the hard mask layer 33 and the sacrificial spacer layer 37. The first planarization layer 39 may be formed of a substance which is the same as or different from the first line patterns 34A. For example, the first planarization layer 39 and the first line patterns 34A may include a carbon-containing layer. Alternately, the first planarization layer 39 may include a polysilicon layer, and the first line patterns 34A may include a carbon-containing layer.

Figure 4D:
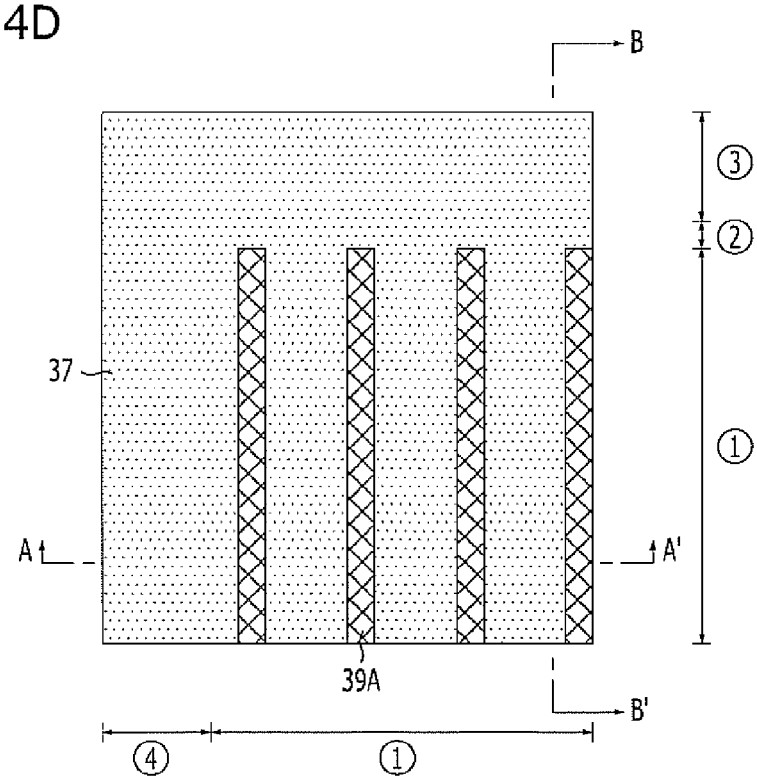
Figure 5D:
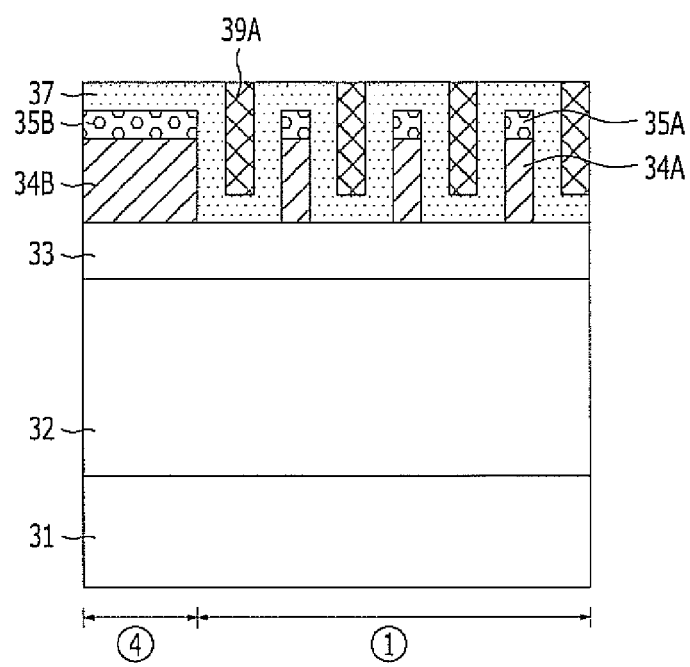
Figure 6D:
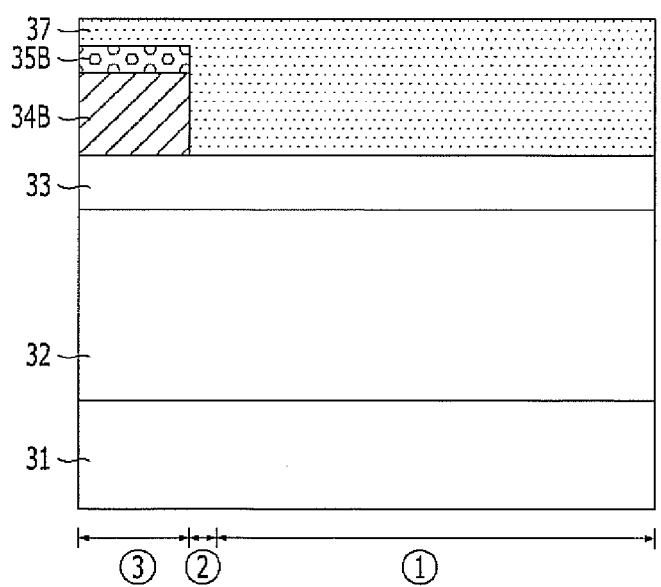

Referring to FIGS. 4D, 5D and 6D, the first planarization layer 39 is planarized. Planarization is performed until the surface of the sacrificial spacer layer 37 is exposed. Thus, second line patterns 39A are formed. The second line patterns 39A and the first line patterns 34A are alternately disposed, and the sacrificial spacer layer 37 is exposed between the first line patterns 34A and the second line patterns 39A. The second line patterns 39A may be formed only in the cell matrix region $\hat{1}$.

Figure 4E:
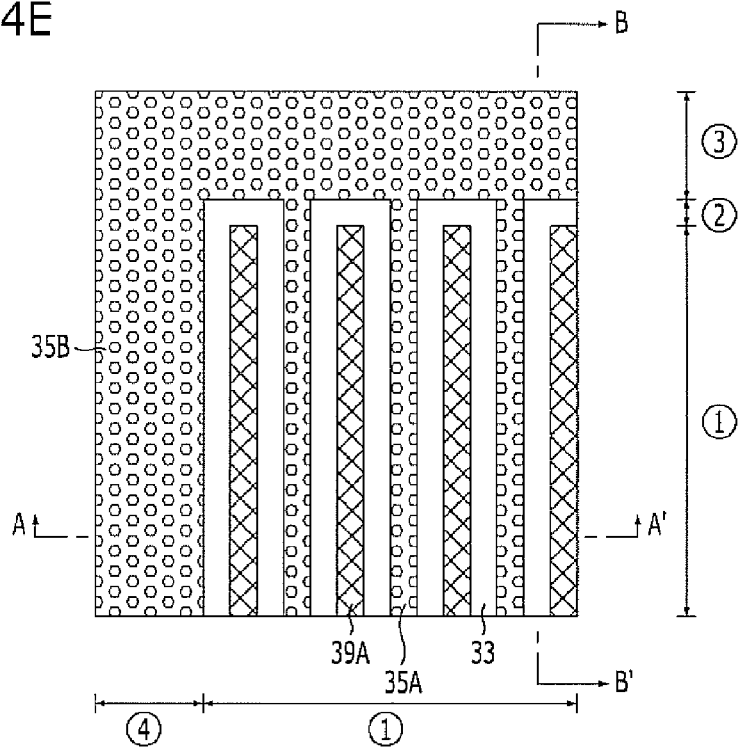
Figure 5E:
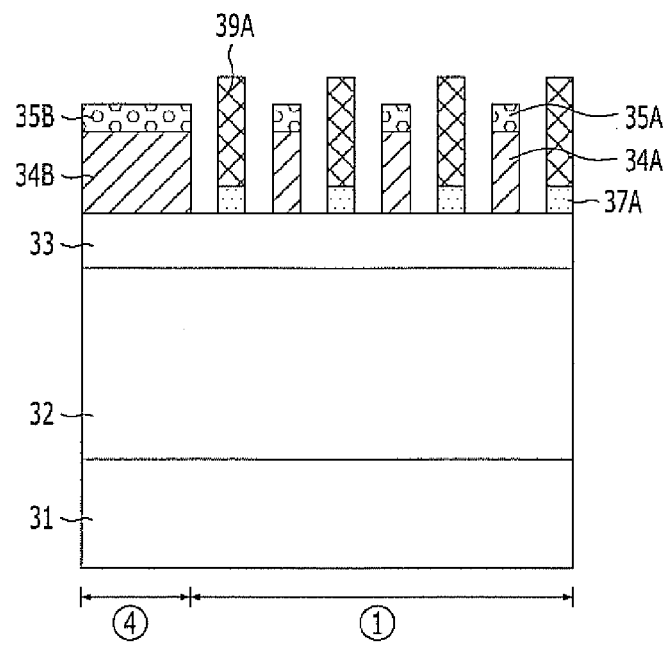
Figure 6E:
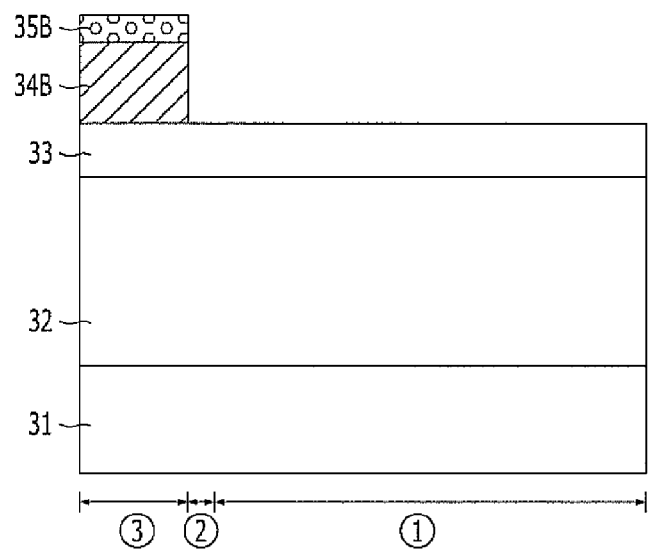

Referring to FIGS. 4E, 5E and 6E, portions of the sacrificial spacer layer 37 are selectively removed. Thus, the hard mask layer 33 is exposed between the first line patterns 34A and the second line patterns 39A. Sacrificial spacer layer patterns 37A may remain under the second line patterns 39A.

As describe above, a first etch mask is formed by removing the sacrificial spacer layer 37. The first etch mask includes a plurality of first line patterns 34A and the second line patterns 39A.

The above process is the negative SPT (NSPT) process. The first line patterns 34A and the second line patterns 39A act as an etch mask for the subsequent etch process.

Figure 4F:
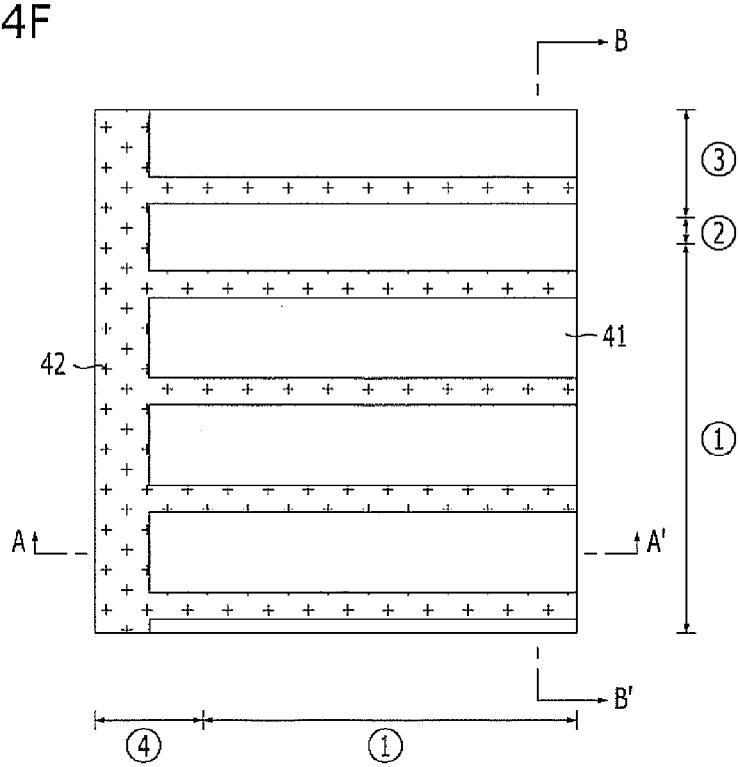
Figure 5F:
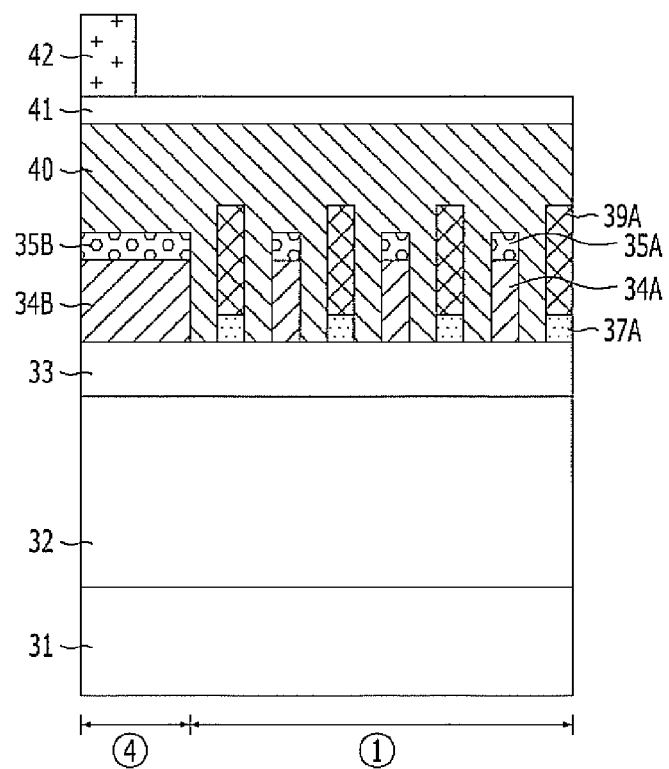
Figure 6F:
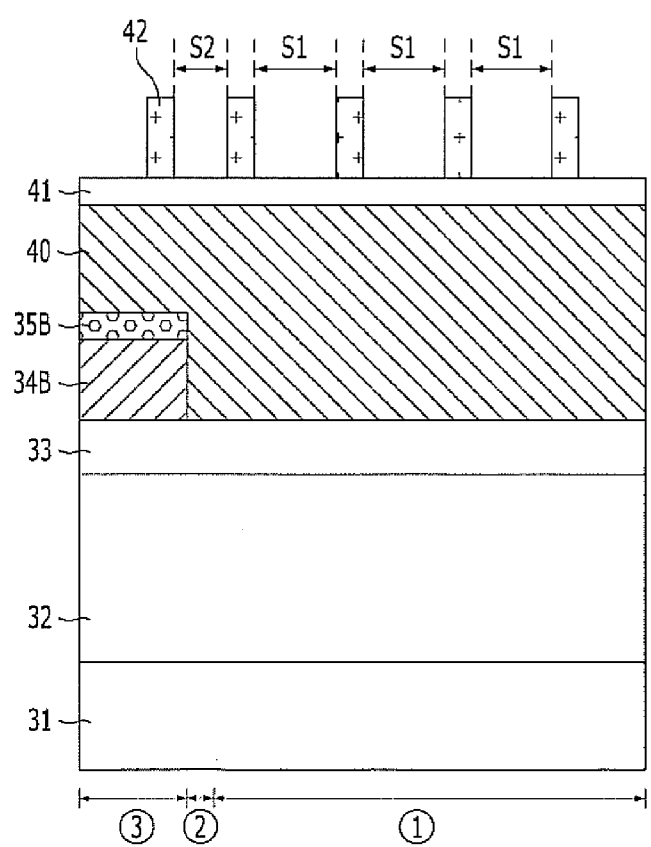

Referring to FIGS. 4F, 5F and 6F, a second planarization layer 40 is formed on the entire surface including the first line patterns 34A and the second line patterns 39A. The second planarization layer 40 may include a carbon-containing layer. For example, the second planarization layer 40 may include spin-on carbon (SOC) formed through spin-on coating. The second planarization layer 40 is formed to a thickness capable of filling the gaps between the first line patterns 34A and the second line patterns 39A. By forming the second planarization layer 40 through spin-on coating, the gaps between the first line patterns 34A and the second line patterns 39A may be filled without voids. Moreover, the second planarization layer 40 may be used as mask patterns for etching the hard mask layer 33. Alternate to the carbon-containing layer, the second planarization layer 40 may use a substance having an etching selectivity with respect to the hard mask layer 33. The second planarization layer 40 may be formed of a substance that is the same as or different from the first line patterns 34A.

After forming a second silicon oxynitride layer 41 on the second planarization layer 40, second photoresist patterns 42 are formed on the second silicon oxynitride layer 41. The second photoresist patterns 42 are line patterns extending in a direction crossing with the first photoresist patterns 36A. The second photoresist patterns 42 may be patterned to a ¼ pitch or may be patterned up to a ⅔ pitch in consideration of an etch trimming target in a subsequent process. The second silicon oxynitride layer 41 may be used as a mask for etching the second planarization layer 40. Alternate to the second silicon oxynitride layer 41, a substance with an etching selectivity with respect to the second planarization layer 40 may be used. While not shown, an anti-reflective layer may be additionally formed on the second silicon oxynitride layer 41. The anti-reflective layer serves to prevent exposure characteristics from deteriorating due to scattered reflection while forming the second photoresist patterns 42. The anti-reflective layer may include a BARC (bottom anti-reflective coating). In the case where the second silicon oxynitride layer 41 can perform a function of preventing scattered reflection, the anti-reflective layer may be omitted.

The second photoresist patterns 42 are a sacrificial substance that is removed after subsequently forming spacers. Therefore, the second photoresist patterns 42 may be referred to as 'sacrificial line patterns'. The second photoresist patterns 42 may include a plurality of lines, where one end of each of the lines may be coupled with other ends of the lines. The coupled ends may be positioned in the second peripheral region $\hat{4}$. The lines of the second photoresist patterns 42 may have the same line width and may be formed with a first spacing in the cell matrix region $\hat{1}$. For example, the lines formed in the cell matrix region $\hat{1}$ may have a first spacing corresponding to a ¾ pitch. The line formed in the cell matrix edge region $\hat{2}$ may be formed with a second spacing corresponding to a ⅔ pitch. The second spacing may be narrower than the first spacing. The second spacing is set to a size equal to or less than the ⅔ pitch. With such spacing, a portion lying under the second spacing corresponds to the cell matrix edge region $\hat{2}$, and a spacer layer is subsequently gap-filled in the second spacing. As the spacer layer is gap-filled in the cell matrix edge region $\hat{2}$, the cell matrix edge region $\hat{2}$ is protected from a subsequent etching process.

Figure 4G:
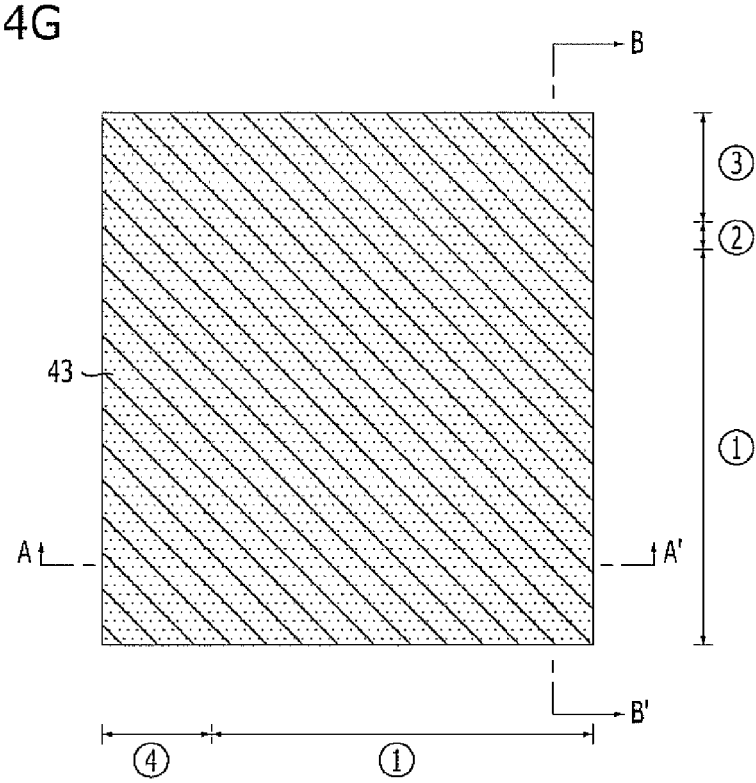
Figure 5G:
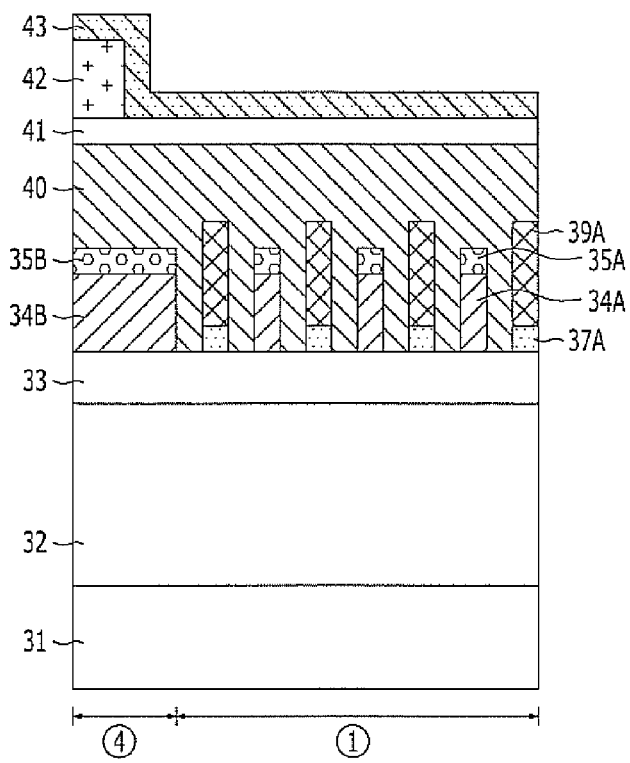
Figure 6G:
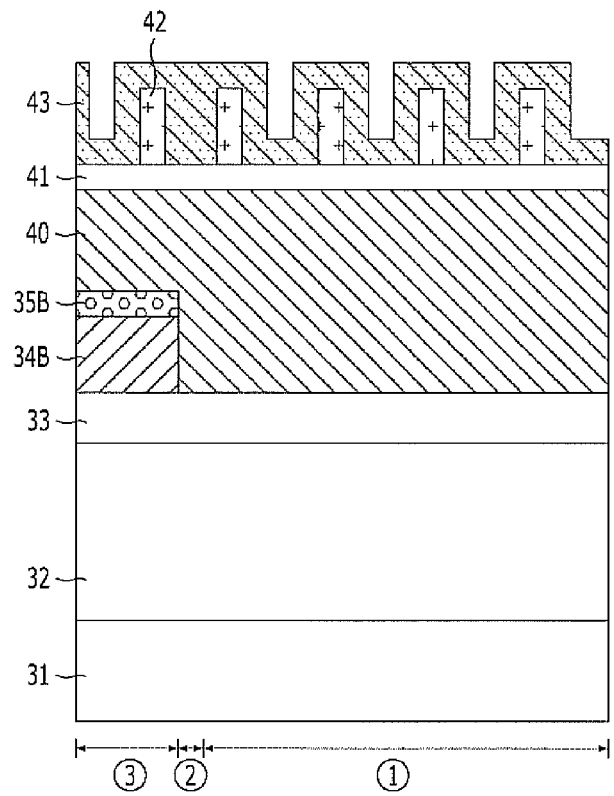

Referring to FIGS. 4G, 5G and 6G, a spacer layer 43 is formed on the entire surface including the second photoresist patterns 42. When forming the spacer layer 43, the spacer layer 43 is formed in the cell matrix region $\hat{1}$ in such a way as to define gaps between the sidewalls of the second photoresist patterns 42 and is formed in the cell matrix edge region $\hat{2}$ in such a way as to fill the second spacing. The thickness of the spacer layer 43 is set to a ¼ pitch. The spacer layer 43 may be formed of a substance having an etching selectivity difference from the second photoresist patterns 42. The spacer layer 43 may be formed using a dielectric layer. For example, the spacer layer 43 may be formed as an oxide layer such as an ultra-low temperature oxide (ULTO). When assuming that a pitch has a width corresponding to the sum of 1P, 2P, 3P and 4P (1P=2P=3P=4P), the 1P may be defined by the second photoresist pattern 42, and the 2P and 3P may be defined by the spacer layer 43. Accordingly, after the spacer layer 43 is formed, a gap having a same width as the 3P is defined.

Figure 4H:
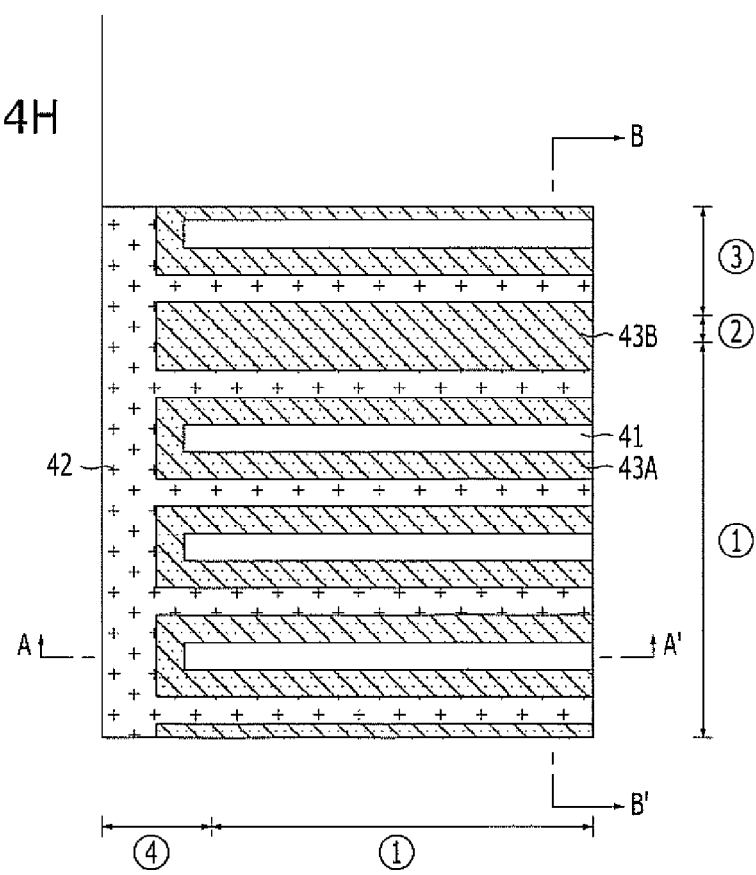
Figure 5H:
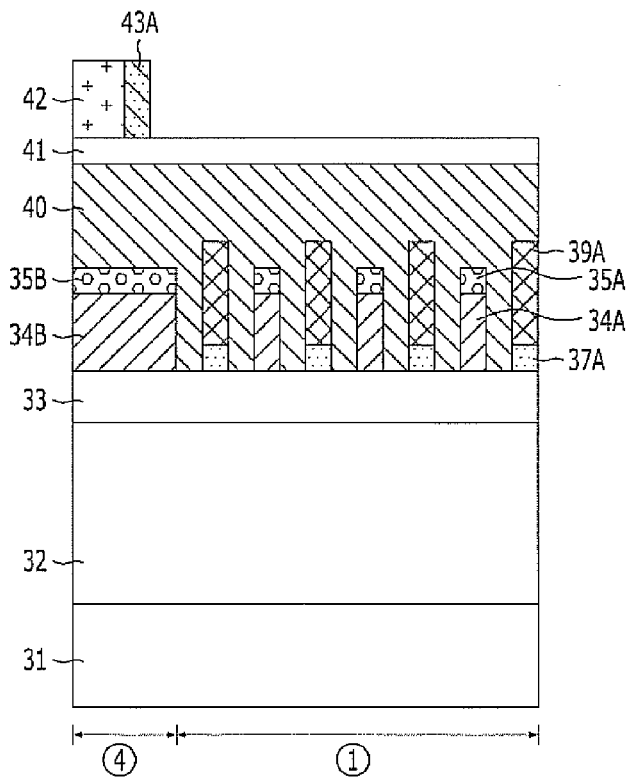
Figure 6H:
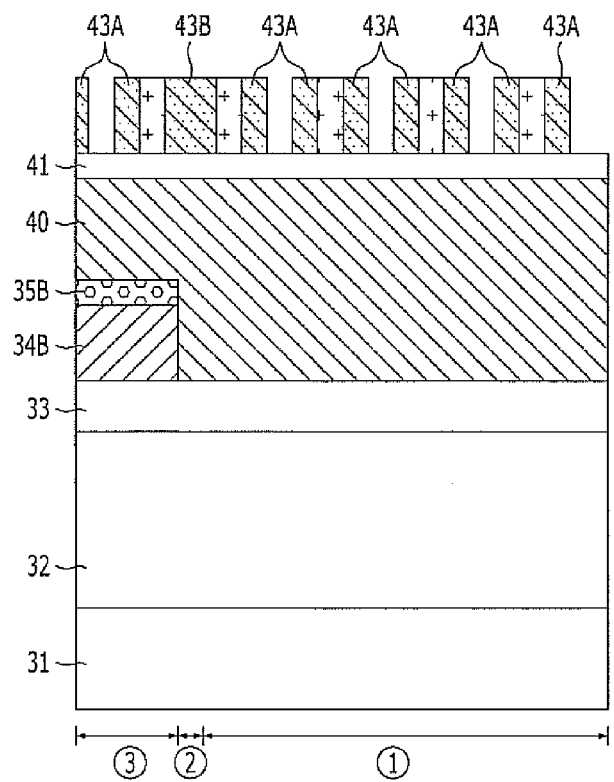

Referring to FIGS. 4H, 5H and 6H, by etching back the spacer layer 43, spacer patterns 43A are formed on both sidewalls of the second photoresist patterns 42. The spacer patterns 43A have line shapes. The spacer patterns 43A are arranged in the direction crossing with the first line patterns 34A and the second line patterns 39A. Each spacer pattern 43A may have a shape formed by coupling two lines. When forming the spacer patterns 43A, a blocking line 43B which blocks the cell matrix edge region $\hat{2}$ is formed. The blocking line 43B is formed by the spacer layer 43 which is filled in the second spacing of the second photoresist patterns 42.

Figure 4I:
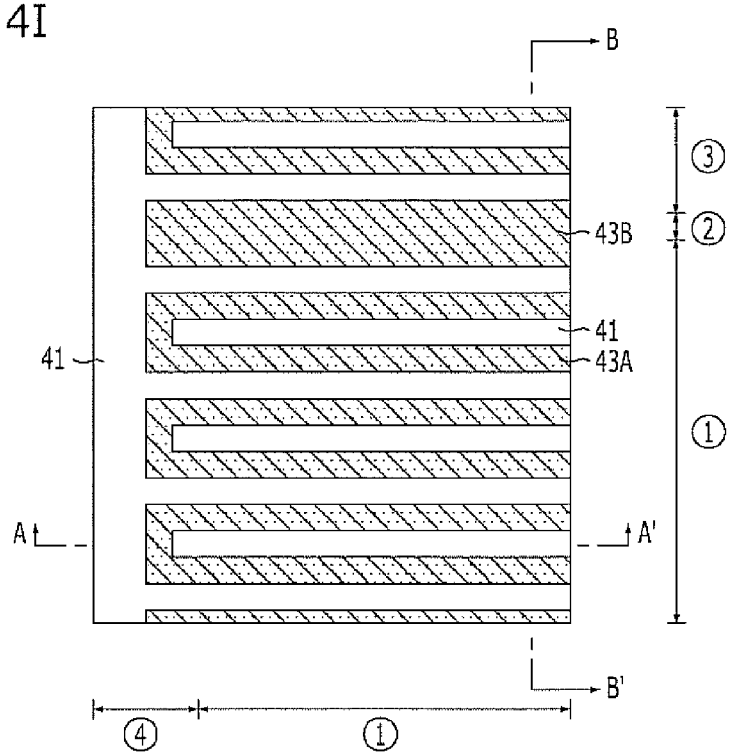
Figure 5I:
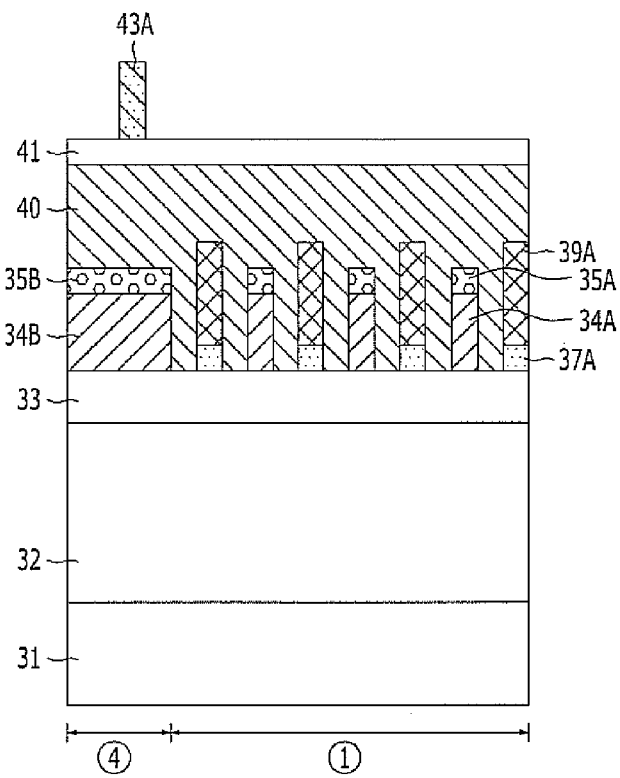
Figure 6I:
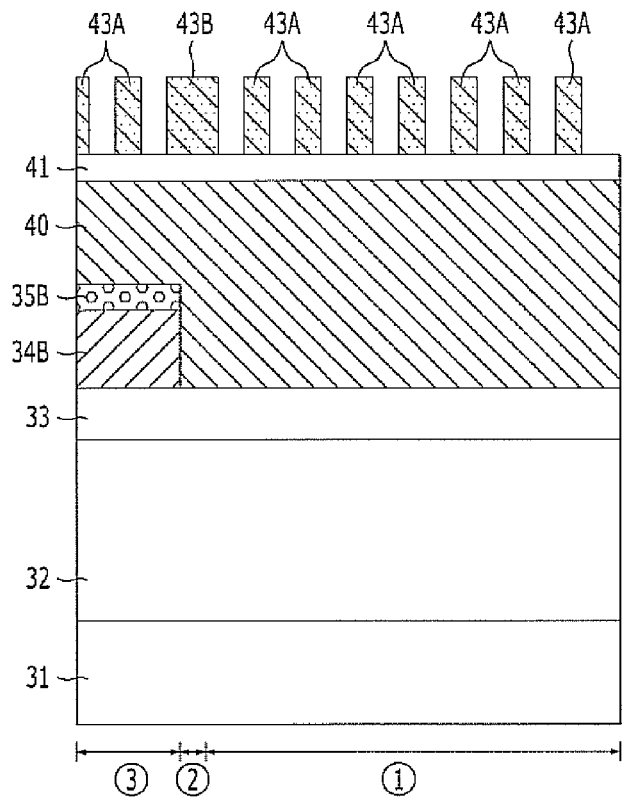

Referring to FIGS. 4I, 5I and 6I, the second photoresist patterns 42 are removed. Thus, the second silicon oxynitride layer 41 is exposed between the spacer patterns 43A.

As the spacer patterns 43A and the blocking line 43B are formed as described above, the spacer patterns 43A are disposed over the first line patterns 34A and the second line patterns 39A with the second planarization layer 40 interposed therebetween. The spacer patterns 43A are formed in the cell matrix region $\hat{1}$. The blocking line 43B is formed in the cell matrix edge region $\hat{2}$.

The spacer patterns 43A are a substance used as an etch mask in a subsequent etching process. This is referred to as a positive SPT (PSPT) process.

Figure 4J:
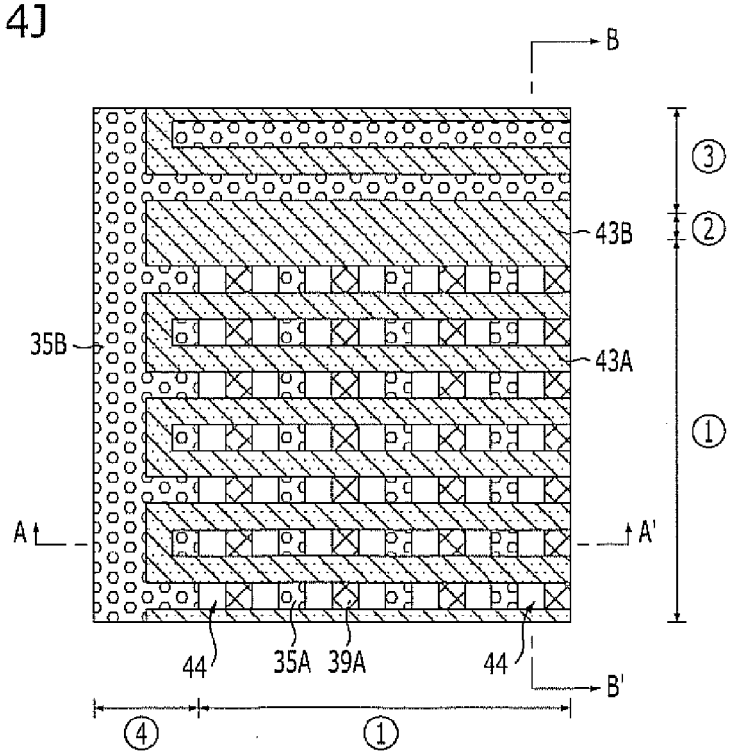
Figure 5J:
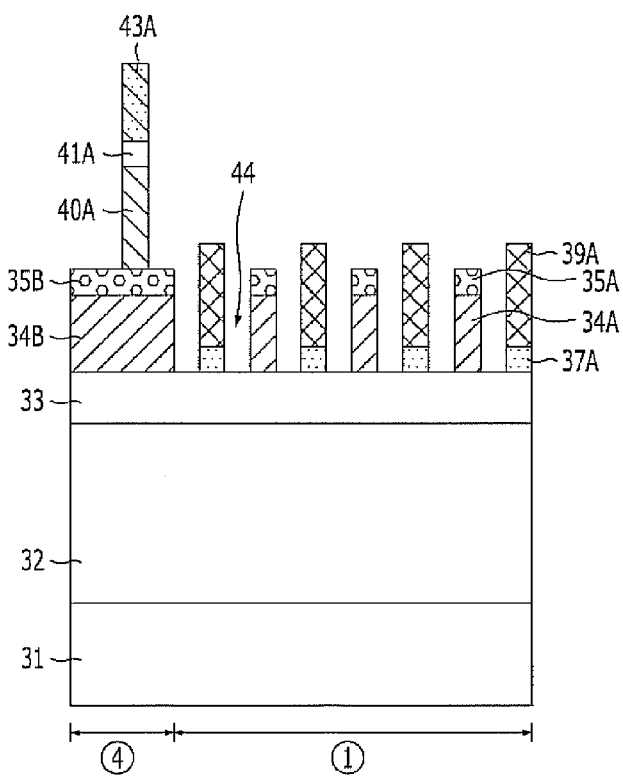
Figure 6J:
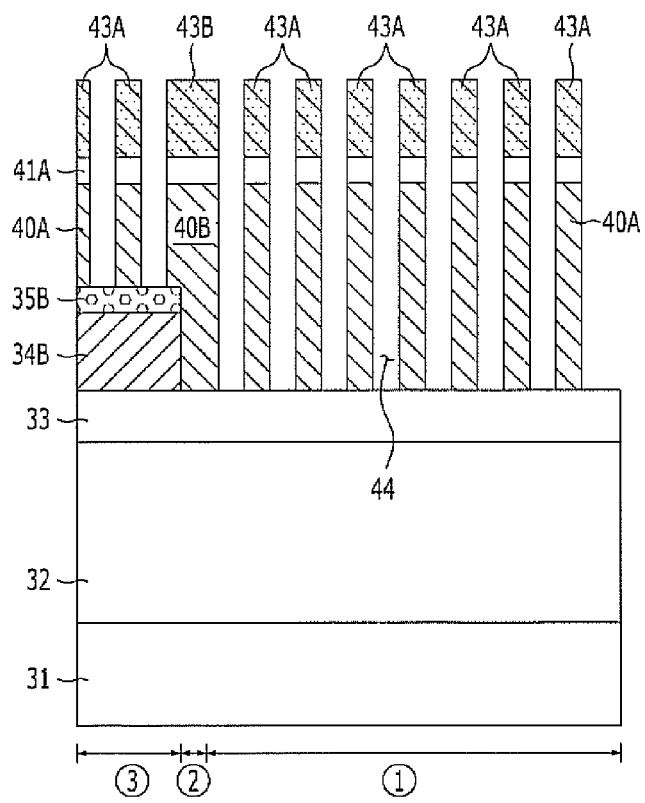

Referring to FIGS. 4J, 5J and 6J, underlying substances are etched using the spacer patterns 43A and the blocking line 43B as an etch mask. First, the second silicon oxynitride layer 41 and the second planarization layer 40 are etched using the spacer patterns 43A and the blocking line 43B as an etch mask. Consequently, third line patterns 40A, which are transferred with the shapes of the spacer patterns 43A, may be formed. As the second planarization layer 40 is etched using the blocking line 43B, a blocking pattern 40B is formed. The blocking pattern 40B covers the cell matrix edge region $\hat{2}$. The third line patterns 40A extend in a direction crossing with the first line patterns 34A and the second line patterns 39A. Second silicon oxynitride layer patterns 41A may remain on the third line patterns 40A and the blocking pattern 40B.

By etching the second planarization layer 40 as described above, a second etch mask is formed. The second etch mask includes the third line patterns 40A and the blocking pattern 40B. Openings 44 are defined by a mesh type structure including the first line patterns 34A, the second line patterns 39A and the third line patterns 40A. The openings 44 may have hole shapes.

According to the above-described series of processes, a mask pattern for etching the underlying hard mask layer 33 is completed. The mask pattern includes a plurality of lower level line patterns and a plurality of upper level line patterns. The lower level line patterns include the first line patterns 34A and the second line patterns 39A. The upper level line patterns include the third line patterns 40A. The first line patterns 34A and the second line patterns 39A may be alternately disposed. The third line patterns 40A extend in the direction crossing with the first and second line patterns 34A and 39A. The first line patterns 34A, the second line patterns 39A and the third line patterns 40A may form a mesh type pattern. A spacing between the first line pattern 34A and the second line pattern 39A may be the same with a spacing between the third line patterns 40A.

As a consequence, in the second embodiment, a mask pattern for etching the hard mask layer 33 may be formed by sequentially applying an NSPT process and a PSPT process. In addition, it is not necessary to separately adopt the periphery-close mask (PCM) which covers the peripheral region. Namely, the blocking pattern 40B for covering the cell matrix edge region $\hat{2}$ may be formed in a self-aligned manner.

Figure 4K:
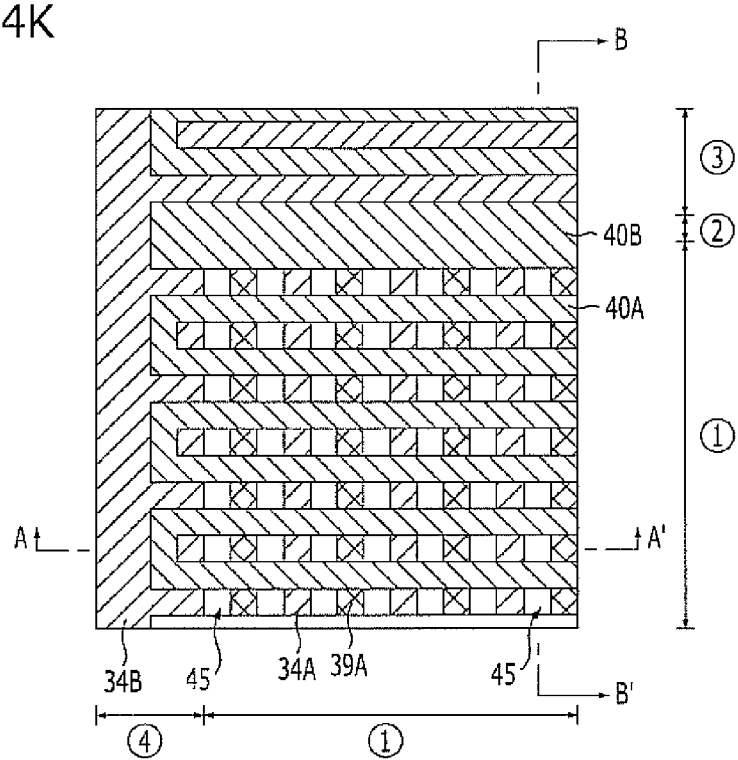
Figure 5K:
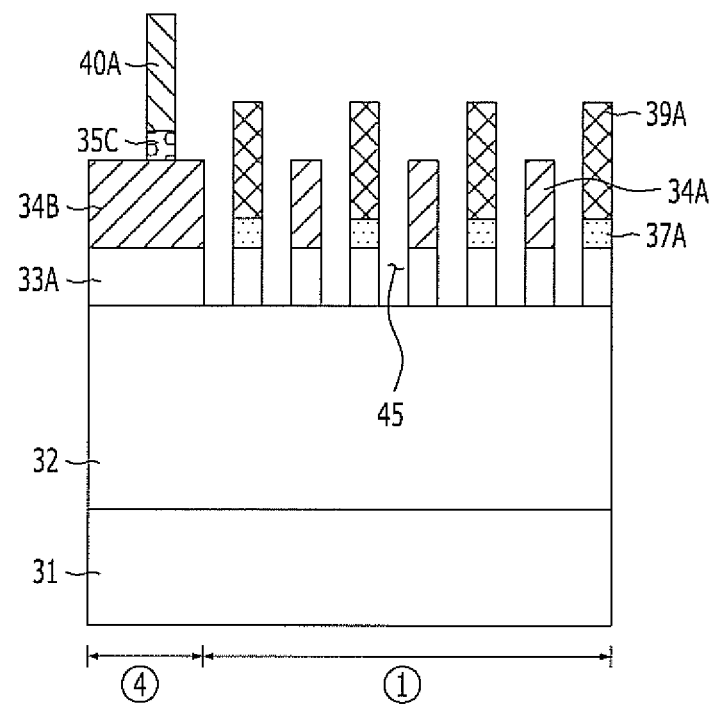
Figure 6K:
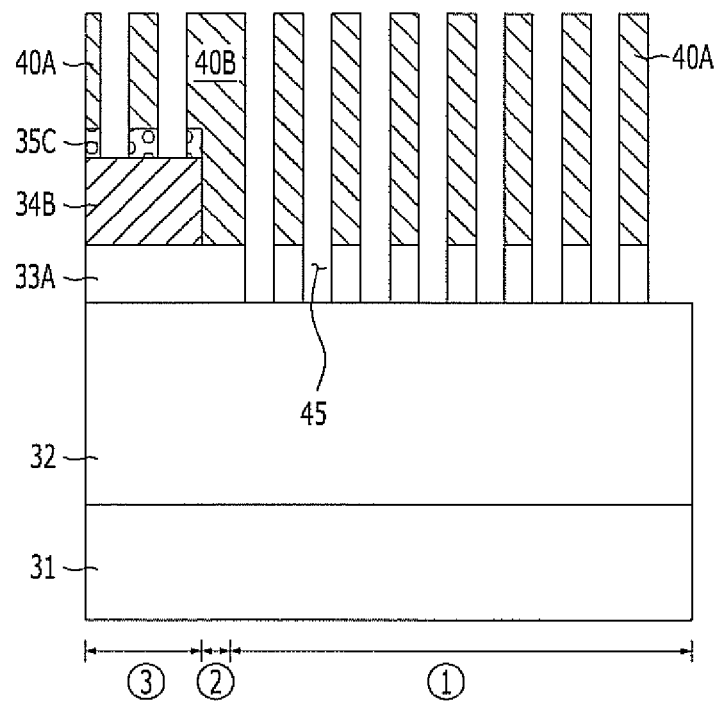

Referring to FIGS. 4K, 5K and 6K, the hard mask layer 33 is etched using the first line patterns 34A, the second line patterns 39A, the third line patterns 40A and the blocking pattern 40B as an etch mask. Thus, hard mask layer patterns 33A with a plurality of holes 45 are formed. The plurality of holes 45 defined in the hard mask layer patterns 33A may have a matrix arrangement. The plurality of holes 45 are regularly arranged and are not defined in the cell matrix edge region $\hat{2}$ due to the presence of the blocking pattern 40B. When etching the hard mask layer 33, the spacer patterns 43A, the blocking line 43B, the first silicon oxynitride layer patterns 35A and 35B and the second silicon oxynitride layer patterns 41A may be consumed and removed in the cell matrix region $\hat{1}$. A first silicon oxynitride layer pattern 35C may remain in the first and second peripheral regions $\hat{3}$ and $\hat{4}$.

Figure 4L:
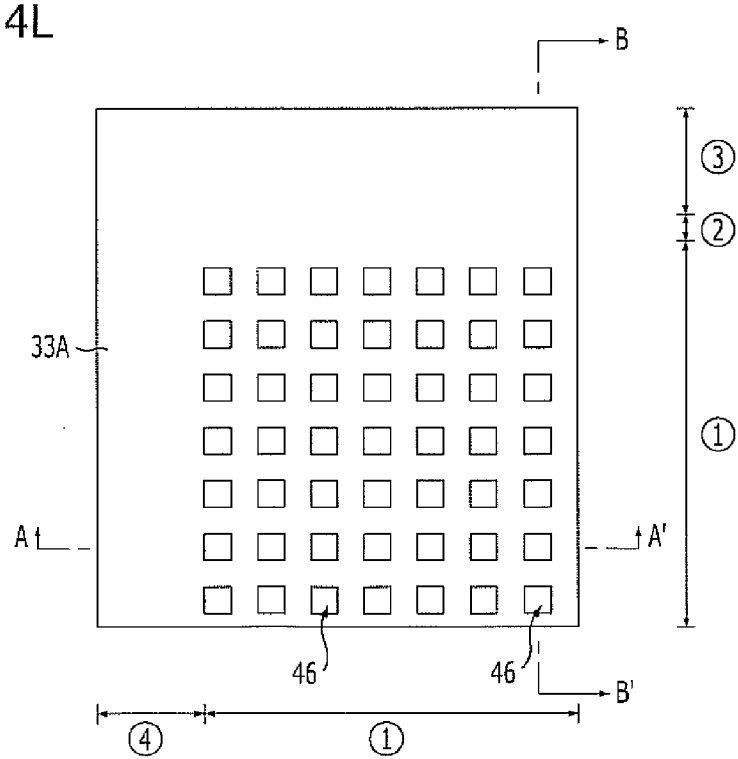
Figure 5L:
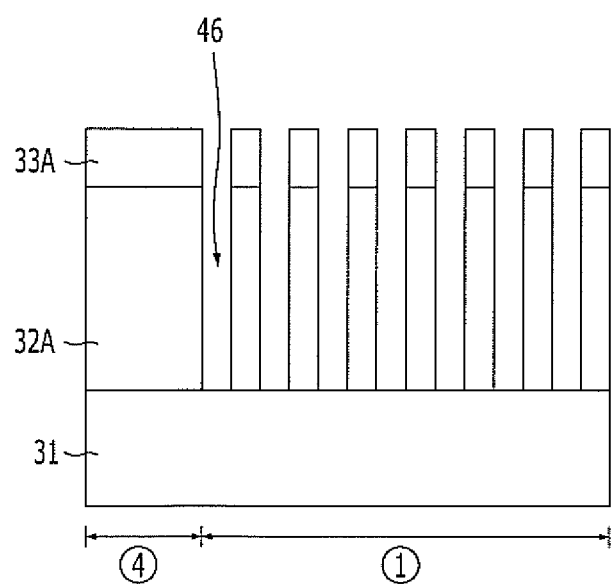
Figure 6L:
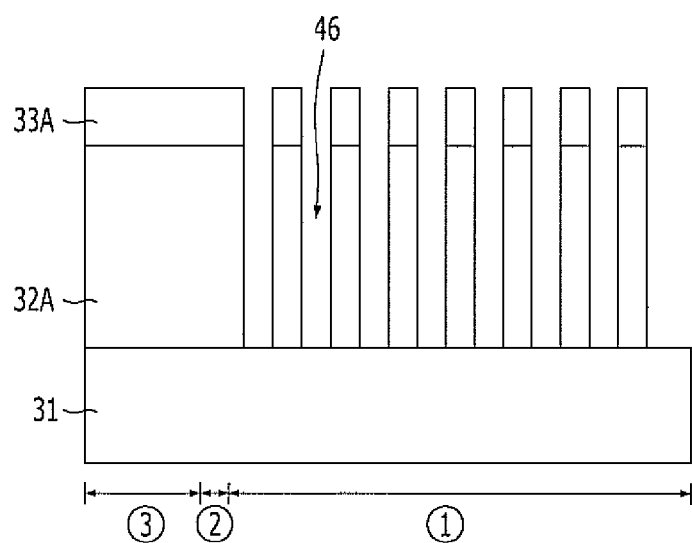

Referring to FIGS. 4L, 5L and 6L, all the first line patterns 34A, the second line patterns 39A, the third line patterns 40A and the blocking pattern 40B are removed. When the hard mask layer patterns 33A have the multi-layered structure, the multiple layers of the hard mask layer 33 may be sequentially etched. During such an etching process, the first silicon oxynitride layer pattern 35C and the sacrificial spacer layer patterns 37A may be removed.

Next, the etching target layer 32 is etched using the hard mask layer patterns 33A as an etch mask. Thus, a plurality of hole patterns 46 are defined in etching target layer patterns 32A. The hole patterns 46 are defined in the cell matrix region $\hat{1}$ and are not defined in the cell matrix edge region $\hat{2}$ and the first and second peripheral regions $\hat{3}$ and $\hat{4}$.

As is apparent from the above descriptions, in the embodiments of the present invention, poor patterning of a cell matrix edge region may be prevented by applying a negative SPT (NSPT) process and a positive SPT (PSPT) once each without adopting a periphery-close mask (PCM) covering a peripheral region. Therefore, hole patterning with parameters of 30 nm or below is obtained without experiencing poor patterning, and thus, capacitors are properly formed.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
    forming an etching target layer over a substrate including a first region and a second region;
    forming a hard mask layer over the etching target layer;
    forming a first etch mask over the hard mask layer, wherein the first etch mask includes a plurality of line patterns and a sacrificial spacer layer formed over the line patterns;
    forming a second etch mask over the first etch mask, wherein the second etch mask includes a mesh type pattern and a blocking pattern covering the second region;
    removing the sacrificial spacer layer;
    forming hard mask layer patterns having a plurality of holes by etching the hard mask layer using the second etch mask and the first etch mask; and forming a plurality of hole patterns in the first region by etching the etching target layer using the hard mask layer patterns as an etch mask.

2. The method according to claim 1, wherein the forming of the second etch mask comprises:
   forming a planarization layer over the first etch mask;
   forming a plurality of sacrificial line patterns over the planarization layer in a direction crossing with the line patterns;
   forming a spacer layer over an entire surface of a structure including the sacrificial line patterns;
   selectively etching the spacer layer and forming spacer patterns on sidewalls of the sacrificial line patterns;
   removing the sacrificial line patterns; and
   forming the mesh type pattern and the blocking pattern by etching the planarization layer using the spacer patterns as an etch mask.

3. The method according to claim 2,
   wherein, in the forming of the plurality of sacrificial line patterns, a plurality of sacrificial line patterns formed in the first region have a first spacing, and a plurality of sacrificial line patterns formed in the second region have a second spacing, and
   wherein the second spacing is narrower than the first spacing.

4. The method according to claim 3, wherein the spacer layer gap-fills the second spacing.

5. The method according to claim 2, wherein the spacer layer comprises an oxide layer.

6. The method according to claim 2, wherein the etching of the planarization layer is performed until etching is stopped at a surface of the sacrificial spacer layer.

7. The method according to claim 1, wherein, in the forming of the second etch mask, the mesh type pattern comprises a plurality of first lines formed between the line patterns and a plurality of second lines contacting the first lines and extending in a direction crossing with the line patterns.

8. The method according to claim 1, wherein the sacrificial spacer layer is formed as an oxide layer.

9. The method according to claim 1, wherein the line patterns and the mesh type pattern are formed as a spin-on carbon layer.

10. The method according to claim 1, wherein the first region comprises a cell matrix region and the second region comprises an edge region of the cell matrix region.

11. A method for fabricating a semiconductor device, comprising:
    forming an etching target layer over a substrate including a first region and a second region;
    forming a hard mask layer over the etching target layer;
    forming a first etch mask including a plurality of first line patterns alternately disposed with a plurality of second line patterns over the hard mask layer;
    forming a second etch mask over the first etch mask, wherein the second etch mask includes a plurality of third line patterns extending in a direction crossing with the first and second line patterns and a blocking pattern covering the second region;
    forming hard mask layer patterns having a plurality of holes by etching the hard mask layer using the second etch mask and the first etch mask; and
    forming a plurality of hole patterns in the first region by etching the etching target layer using the hard mask layer patterns as an etch mask.

12. The method according to claim 11, wherein the forming of the second etch mask comprises:
    forming a planarization layer over the first etch mask;
    forming a plurality of sacrificial line patterns over the planarization layer in a direction crossing with the line patterns;
    forming a spacer layer over an entire surface of a structure including the sacrificial line patterns;
    selectively etching the spacer layer and forming spacer patterns on sidewalls of the sacrificial line patterns;
    removing the sacrificial line patterns; and
    forming the third line patterns and the blocking pattern by etching the planarization layer using the spacer patterns as an etch mask.

13. The method according to claim 12,
    wherein, in the forming of the plurality of sacrificial line patterns, a plurality of sacrificial line patterns formed in the first region have a first spacing and a plurality of sacrificial line patterns formed in the second region have a second spacing, and
    wherein the second spacing is narrower than the first spacing.

14. The method according to claim 13, wherein the spacer layer gap-fills the second spacing.

15. The method according to claim 12, wherein the spacer layer comprises an oxide layer.

16. The method according to claim 11, wherein the first line patterns, the third line patterns and the blocking pattern are each formed as a spin-on carbon layer and the second line patterns are formed as a polysilicon layer.

17. The method according to claim 11, wherein the forming of the first etch mask including a plurality of first line patterns and a plurality of second line patterns comprises:
    forming the plurality of first line patterns using a spin-on carbon layer over the hard mask layer;
    forming a sacrificial spacer layer over the first line patterns;
    gap-filling a polysilicon layer over the sacrificial spacer layer;
    forming the second line patterns by etching back the polysilicon layer; and
    removing the sacrificial spacer layer between the first line patterns and the second line patterns.

18. The method according to claim 17, wherein the sacrificial spacer layer comprises an oxide layer.

19. The method according to claim 11, wherein the first region comprises a cell matrix region and the second region comprises an edge region of the cell matrix region.

* * * * *